(12) United States Patent
Miyayama et al.

(10) Patent No.: US 8,023,610 B2
(45) Date of Patent: Sep. 20, 2011

(54) SEMICONDUCTOR DEVICE AND SHIFT REGISTER CIRCUIT

(75) Inventors: Takashi Miyayama, Tokyo (JP); Youichi Tobita, Tokyo (JP); Hiroyuki Murai, Tokyo (JP); Seiichiro Mori, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 11/968,470

(22) Filed: Jan. 2, 2008

(65) Prior Publication Data

US 2008/0187089 A1 Aug. 7, 2008

(30) Foreign Application Priority Data

Feb. 7, 2007 (JP) ................................. 2007-027595

(51) Int. Cl.
*G11C 19/00* (2006.01)
(52) U.S. Cl. ................. 377/64; 377/68; 377/78; 377/79
(58) Field of Classification Search .................. None
See application file for complete search history.

(56) References Cited

U.S. PATENT DOCUMENTS

| | | | | | |
|---|---|---|---|---|---|
| 4,623,908 | A | * | 11/1986 | Oshima et al. ................. | 257/66 |
| 5,264,720 | A | * | 11/1993 | Muto et al. .................... | 257/348 |
| 6,426,743 | B1 | * | 7/2002 | Yeo et al. ....................... | 345/213 |
| 2003/0231735 | A1 | * | 12/2003 | Moon et al. .................... | 377/64 |
| 2006/0071923 | A1 | | 4/2006 | Lee et al. | |
| 2007/0248204 | A1 | * | 10/2007 | Tobita ............................. | 377/64 |
| 2007/0274433 | A1 | * | 11/2007 | Tobita ............................. | 377/64 |
| 2008/0002805 | A1 | * | 1/2008 | Tobita et al. .................... | 377/64 |

FOREIGN PATENT DOCUMENTS

| | | |
|---|---|---|
| CN | 1755765 A | 4/2006 |
| JP | 2005-94335 | 4/2005 |
| JP | 2006-344306 | 12/2006 |

OTHER PUBLICATIONS

R.B. Wehrspohn, et al., "Relative importance of the Si-Si bond and Si-H bond for the stability of amorphous silicon thin film transistors", Journal of Applied Physics, January 1, 2000, vol. 87, No. 1, pp. 144-154.

* cited by examiner

*Primary Examiner* — Tuan T Lam
(74) *Attorney, Agent, or Firm* — Oblon, Spivak, McClelland, Maier & Neustadt, L.L.P.

(57) ABSTRACT

A dual-gate transistor formed of two transistors connected in series between a first power terminal and a first node is used as a charging circuit for charging a gate node (first node) of a transistor intended to pull up an output terminal of a unit shift register. The dual-gate transistor is configured such that the connection node (second node) between the two transistors constituting the dual-gate transistor is pulled down to the L level by the capacitive coupling between the gate and second node in accordance with the change of the gate from the H level to the L level.

3 Claims, 27 Drawing Sheets

F I G . 7
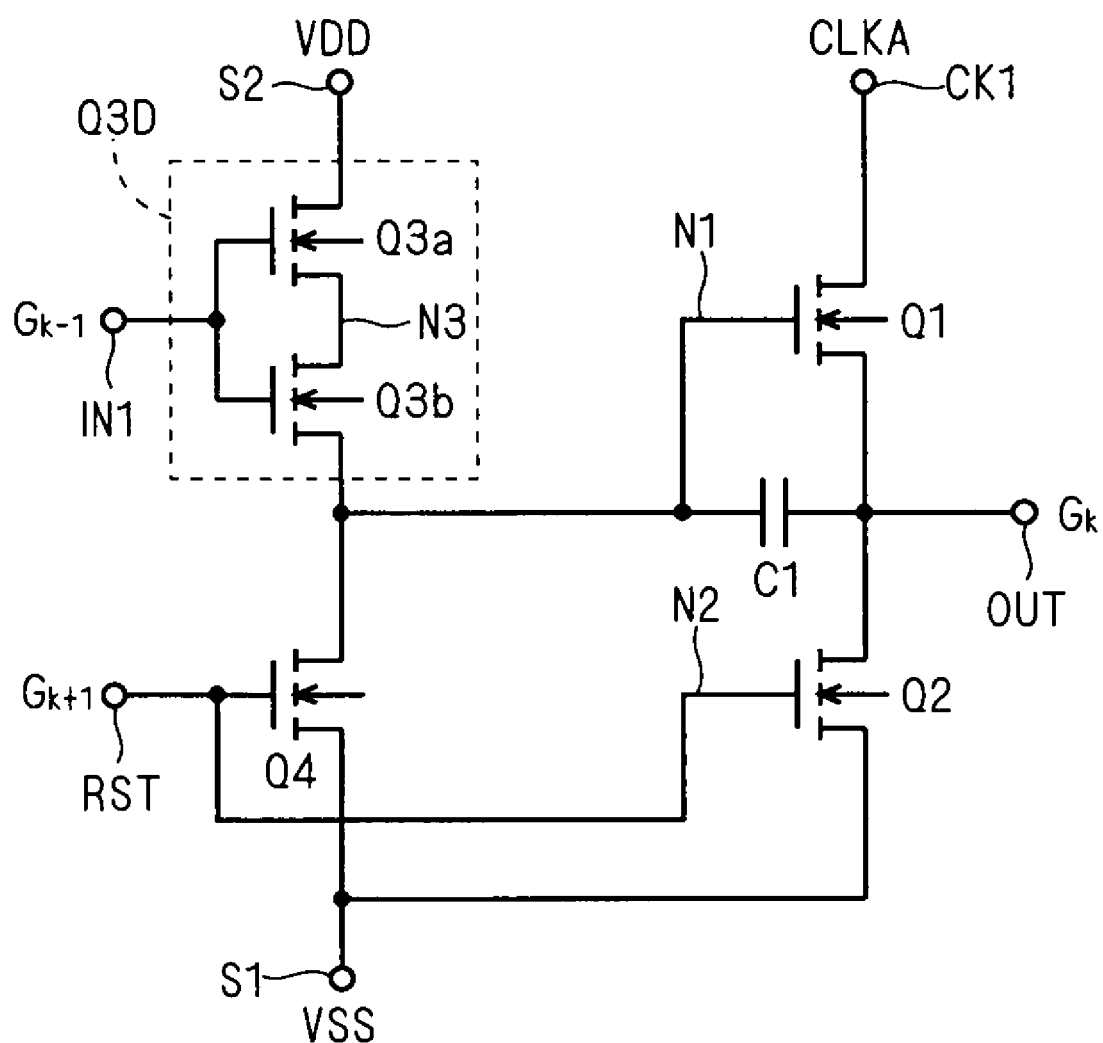

F I G . 1 2
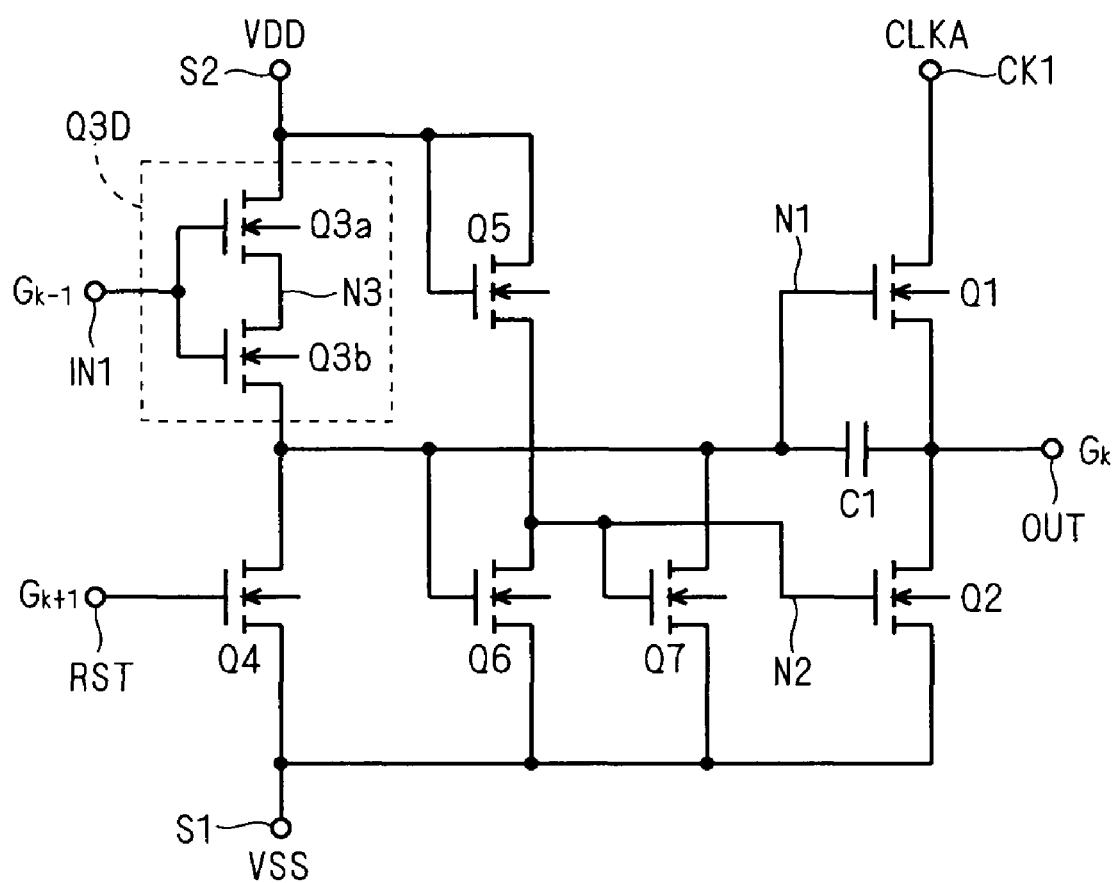

F I G . 1 4
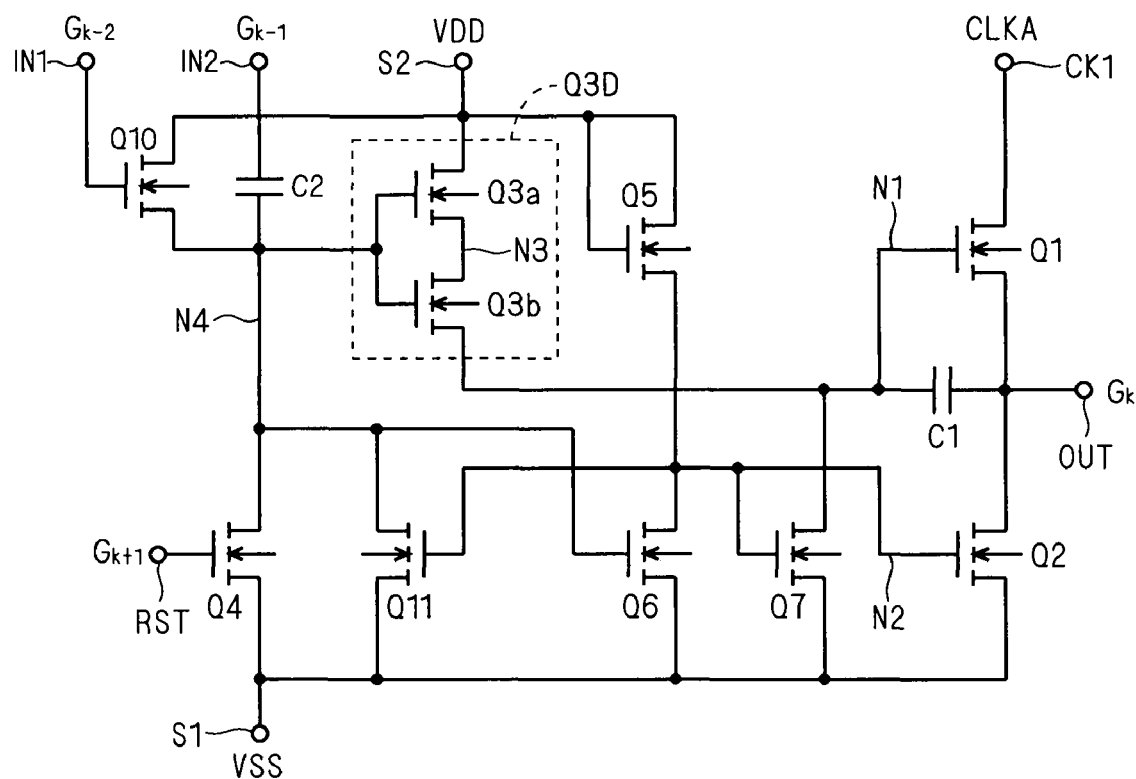

F I G . 1 6
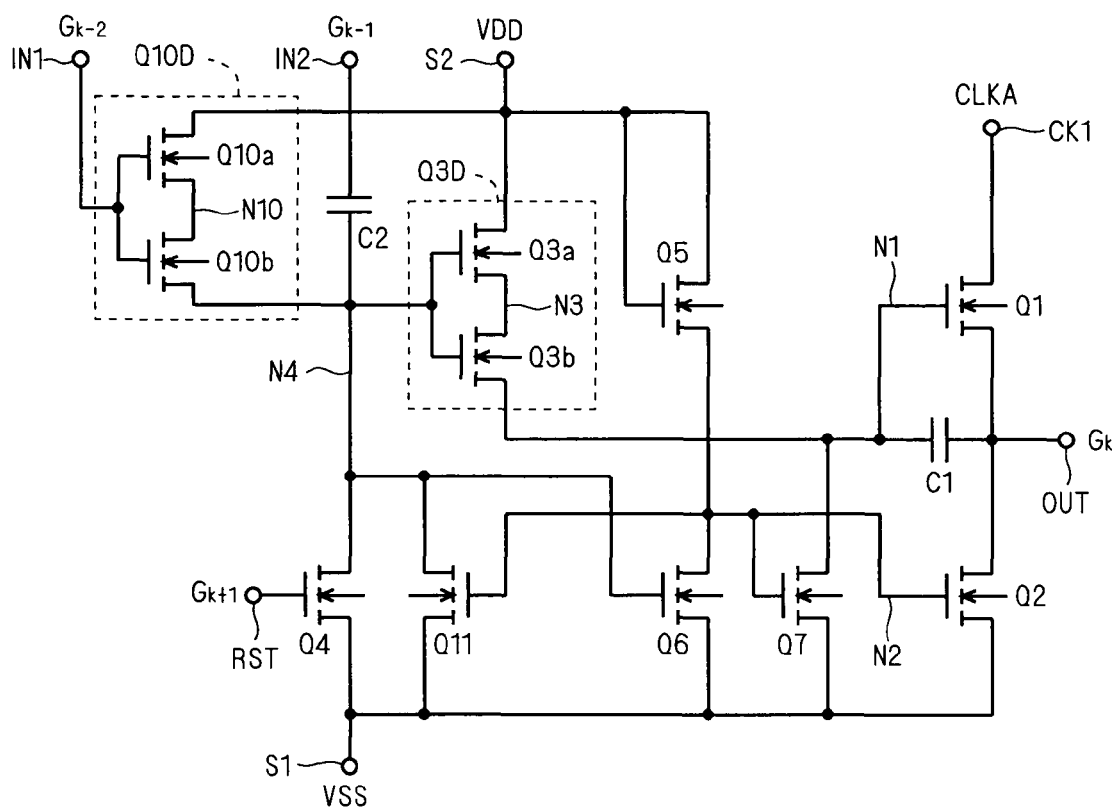

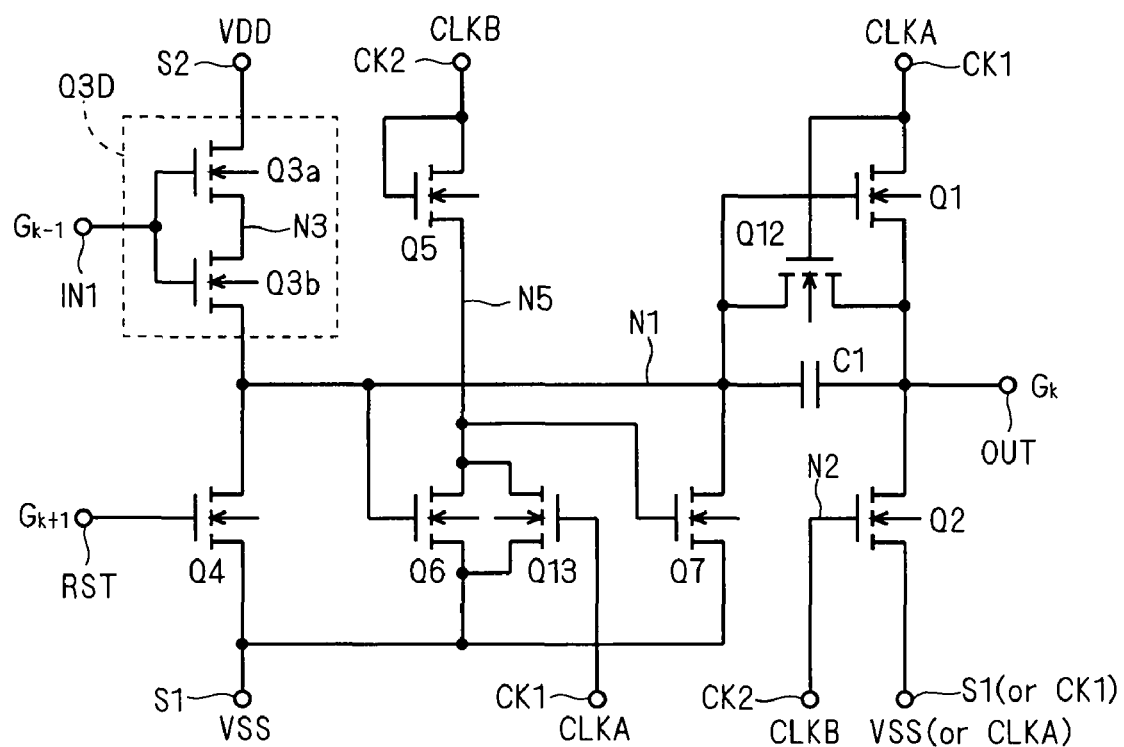
F I G . 1 7

F I G . 1 8
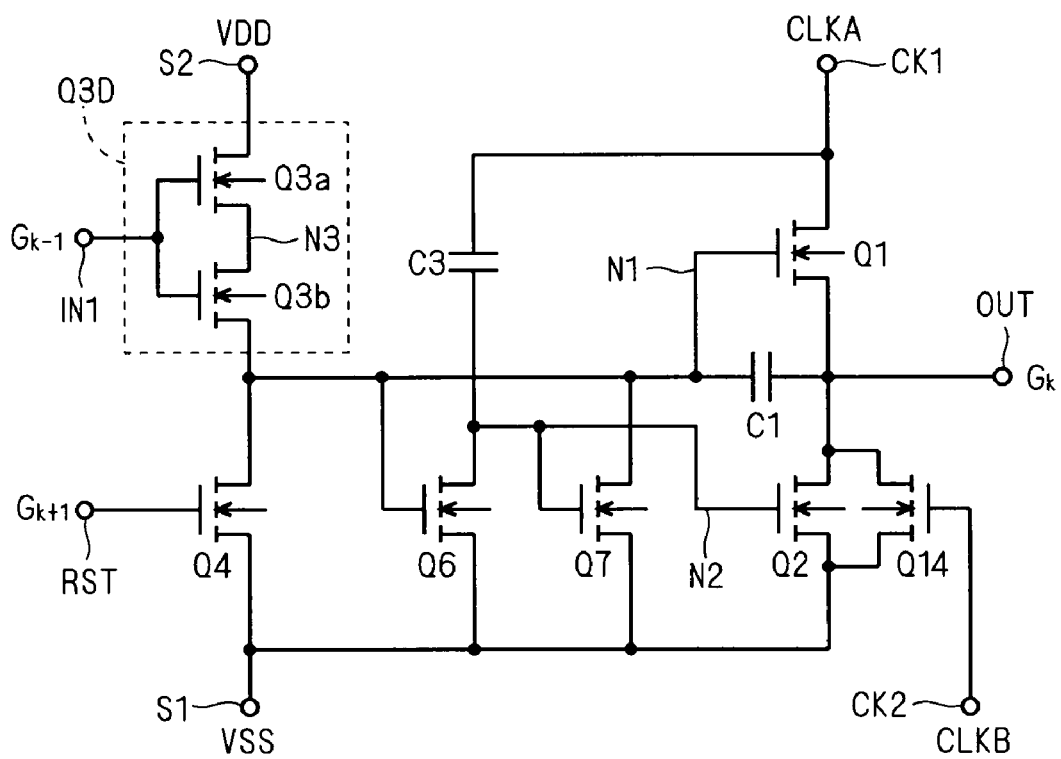

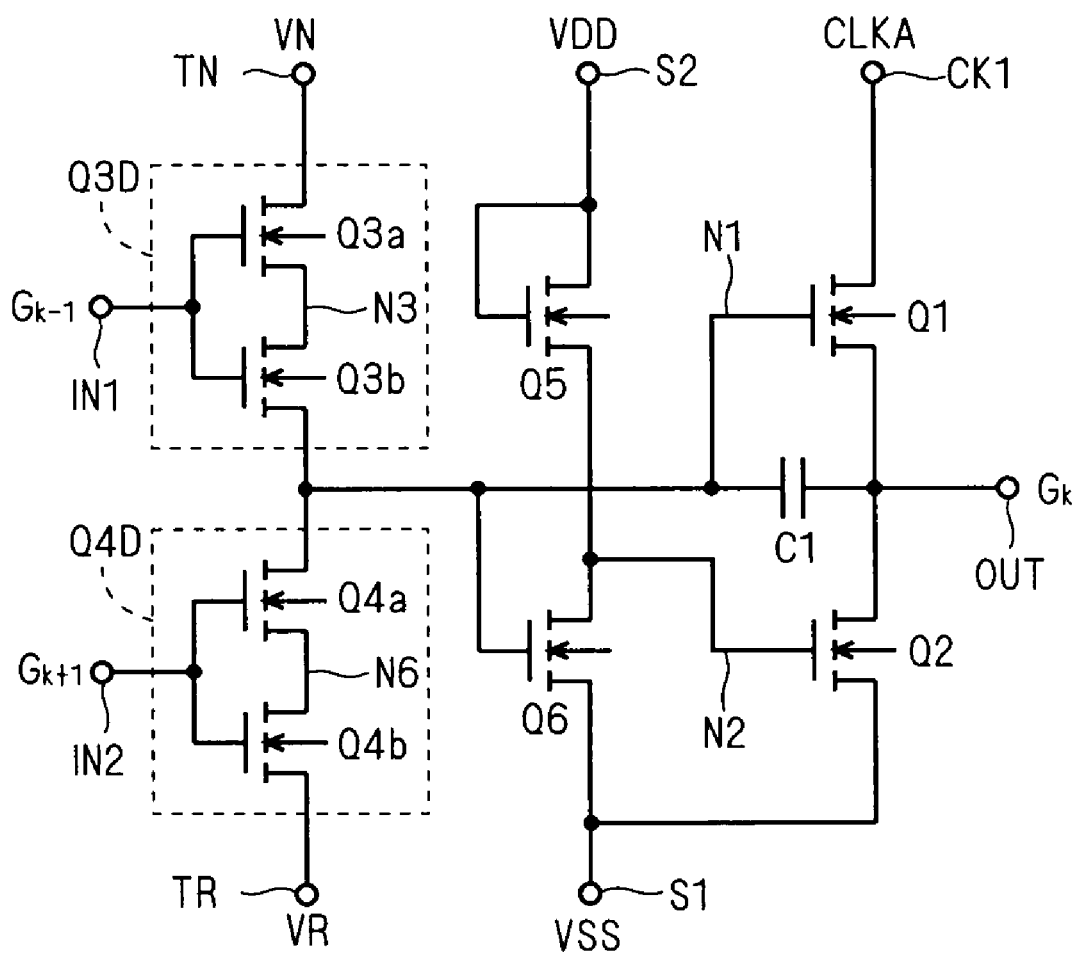
F I G . 1 9

F I G . 2 0
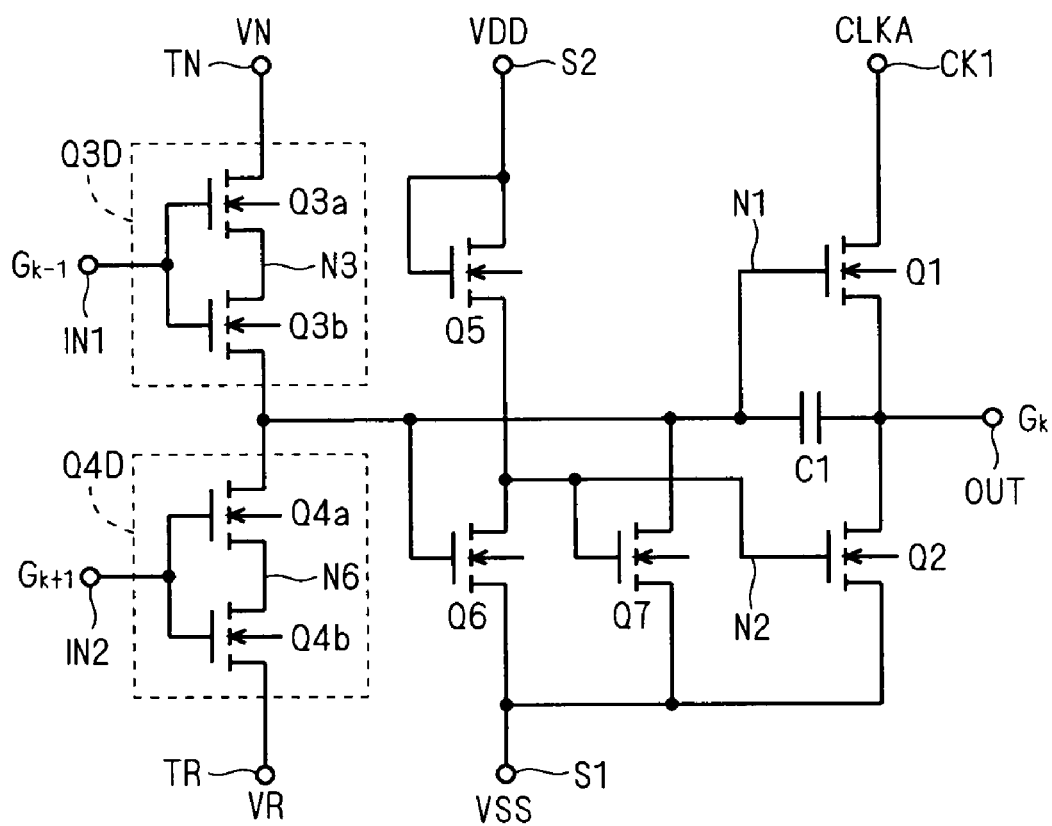

F I G . 2 1
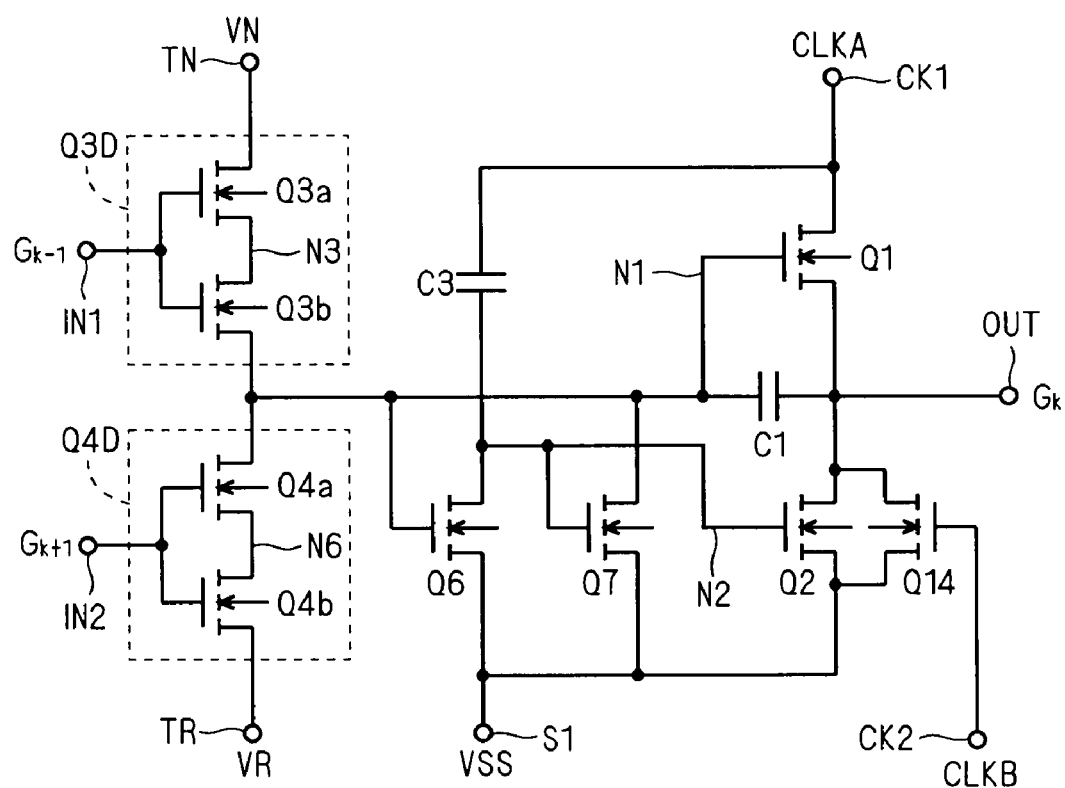

F I G . 2 2
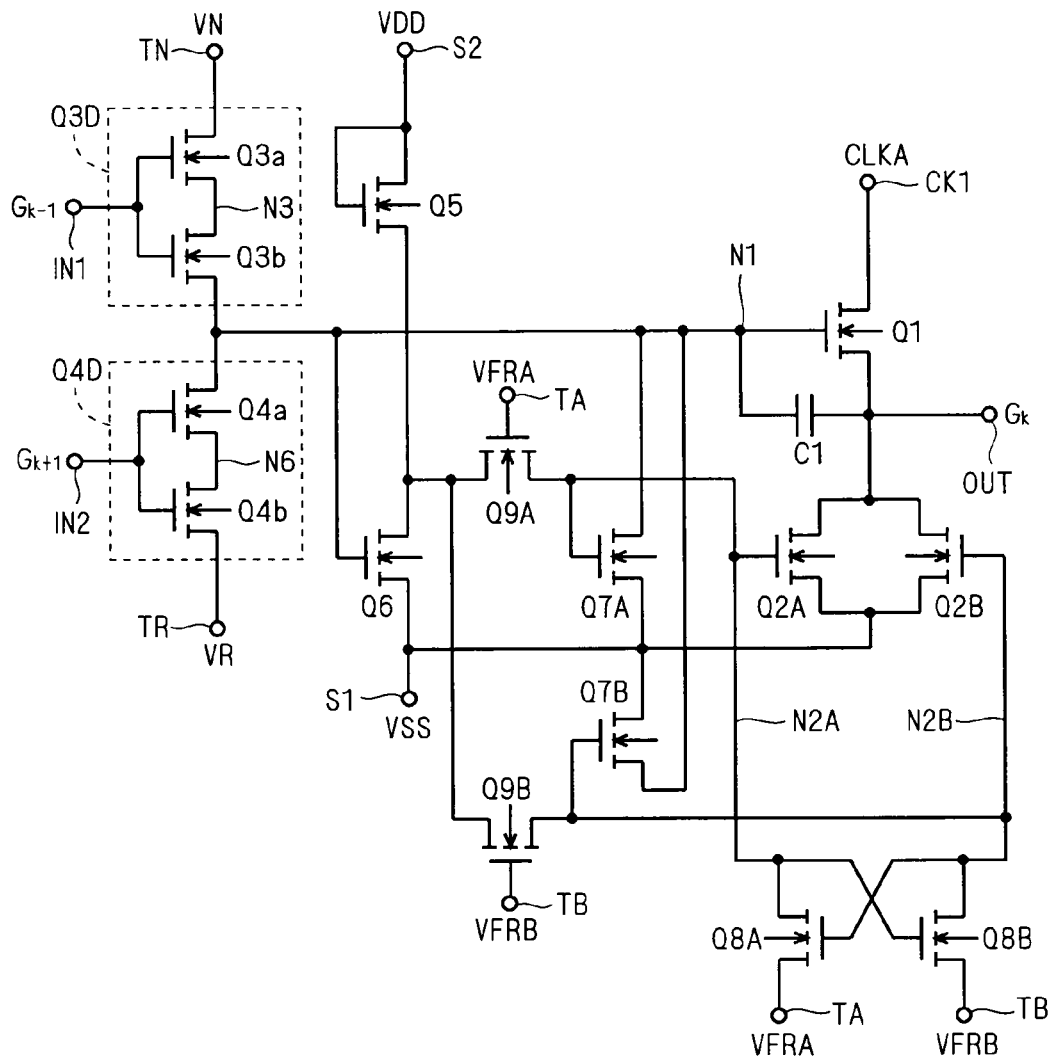

F I G . 2 8 A
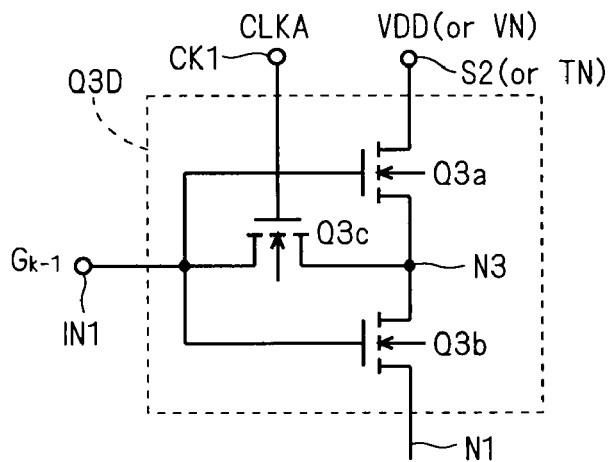
F I G . 2 8 B
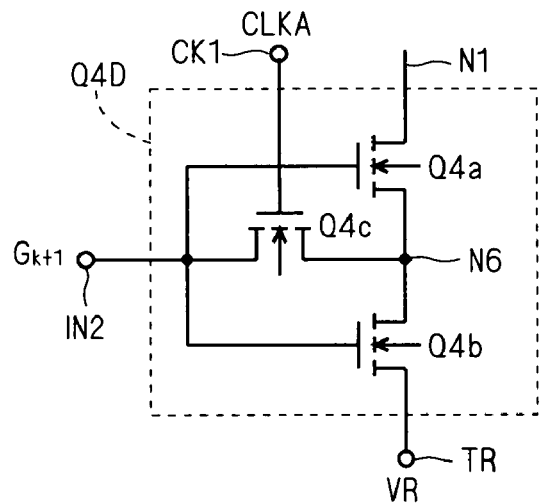
F I G . 2 8 C
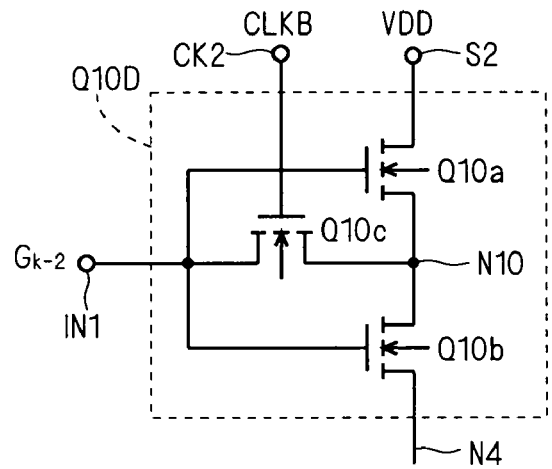

SEMICONDUCTOR DEVICE AND SHIFT REGISTER CIRCUIT

FIELD OF THE INVENTION

The present invention relates to the technique for preventing malfunctions due to degradation in electric characteristics of transistors, and more particularly relates to a semiconductor device capable of suppressing the negative shift of threshold voltage in amorphous silicon thin-film transistors, organic transistors, or the like.

DESCRIPTION OF THE BACKGROUND ART

In an image display apparatus such as a liquid crystal display, a shift register for performing a shift operation in one frame period of a display signal can be used as a gate-line driving circuit (scanning-line driving circuit) for scanning the display panel. It is desirable that this shift register be formed by field effect transistors of the same conductivity type only in order to reduce the number of steps in the manufacturing process of the display apparatus.

A display apparatus employing amorphous silicon thin-film transistors (hereinafter referred to as "a-Si transistors") as shift registers of the gate-line driving circuit easily achieves large-area display with great productivity, and is widely used as the screen of a notebook PC, a large-screen display apparatus, etc.

On the other hand, it is known that a-Si transistors are characterized in that the threshold voltage is shifted when the gate electrode is continuously (dc-) biased. In addition, as shown in "Relative importance of the Si—Si bond and Si—H bond for the stability of amorphous silicon thin film transistors" by R. B. Wehrspohn etc., Journal of applied physics, vol. 87, pp. 144-154, a-Si transistors generally undergo progressive degradation.

Further, since the shift of threshold voltage (Vth shift) of transistors causes malfunctions of the circuit, various types of shift registers having taken measures against such malfunctions have been proposed (e.g., Japanese Patent Application Laid-Open No. 2006-107692). It is known that this Vth shift problem similarly occurs in organic transistors, not only in a-Si transistors.

The threshold voltage of an a-Si transistor shifts in the negative direction with the lapse of time when the potential condition where the gate continues having a lower potential than both the drain and source continues. When the threshold voltage of the a-Si transistor shifts in the negative direction, reducing the gate-source potential to turn off the a-Si transistor (into non-conducting state) will not bring about a complete off state. That is, the a-Si transistor cannot interrupt current completely, which causes malfunctions of the circuit.

A shift register includes an output pull-up transistor (Q1 in FIG. 1 of the present application) supplying a clock signal to an output terminal to pull up the potential of the output terminal and a charging transistor (transistor Q3 in the same drawing) for charging the gate node (node N1 in the same drawing) of the output pull-up transistor. In the normal operation of the shift register as will be described later in detail, the charging transistor is in the aforementioned potential condition (where the gate of the transistor has a lower potential than both the drain and source) for a certain period of time, disadvantageously causing the negative shift of threshold voltage, which results in malfunctions.

SUMMARY OF THE INVENTION

An object of the present invention is to provide a transistor capable of suppressing the negative shift of threshold voltage, thereby preventing malfunctions of a semiconductor device including a shift register.

A first aspect of the present invention is directed to a semiconductor device including a plurality of first transistors connected in series between predetermined first and second nodes. The plurality of first transistors each have a control electrode connected to each other. Each of connection nodes between the plurality of first transistors is a third node. When the control electrode changes from an H (High) level higher than a threshold voltage of the plurality of first transistors where each of the first to third nodes and the control electrode is H level to an L (low) level lower than the threshold voltage while the first and second nodes are kept at the H level, the third node is pulled down to the L level accordingly.

A second aspect of the present invention is directed to a shift register including an input terminal, an output terminal, a first clock terminal and a reset terminal, a first transistor configured to supply a first clock signal received at the first clock terminal to the output terminal, a second transistor configured to discharge the output terminal, a charging circuit configured to charge a first node to which a control electrode of the first transistor is connected, in accordance with an input signal received at the input terminal, and a discharging circuit configured to discharge the first node in accordance with a reset signal received at the reset terminal. The charging circuit includes a plurality of third transistors connected in series between the first node and a power terminal and having control electrodes connected in common to the input terminal.

According to the semiconductor device of the present invention, the potential condition where both the source and drain are at the H level and the control electrode is at the L level is prevented from occurring in each of the transistors connected in series, which prevents the threshold voltage of the transistors from shifting in the negative direction. Accordingly, each transistor is turned off (brought into the cut-off state) with reliability when the control electrode is brought into the L level, which prevents the semiconductor device from malfunctioning.

According to the shift register of the present invention, the potential condition where both the source and drain are at the H level and the control electrode is at the L level is prevented from occurring in each of the transistors constituting the charging circuit for the control electrode of the first transistor, which prevents the threshold voltage of the transistors from shifting in the negative direction. Accordingly, the charging circuit is turned off (brought into the cut-off state) with reliability when the control electrode of the charging circuit is brought into the L level, preventing the first transistor from turning on unnecessarily, which prevents the shift register from malfunctioning.

These and other objects, features, aspects and advantages of the present invention will become more apparent from the following detailed description of the present invention when taken in conjunction with the accompanying drawings.

BRIEF DESCRIPTION OF THE DRAWINGS

FIG. 7 is a circuit diagram of a unit shift register according to a first preferred embodiment of the present invention;

FIG. 12 is a circuit diagram of a unit shift register according to a third preferred embodiment of the present invention;

FIG. 14 is a circuit diagram of a unit shift register according to a fifth preferred embodiment of the present invention;

FIG. 16 is a circuit diagram of a unit shift register according to a variation of the fifth preferred embodiment;

FIG. 17 is a circuit diagram of a unit shift register according to a sixth preferred embodiment of the present invention;

FIG. 18 is a circuit diagram of a unit shift register according to a seventh preferred embodiment of the present invention;

FIG. 19 is a circuit diagram of a unit shift register according to an eighth preferred embodiment of the present invention;

FIGS. 20 to 22 are circuit diagrams each showing a unit shift register according to a variation of the eighth preferred embodiment;

FIGS. 28A to 28C show the configuration of a dual-gate transistor according to a twelfth preferred embodiment of the present invention.

Figure 1:
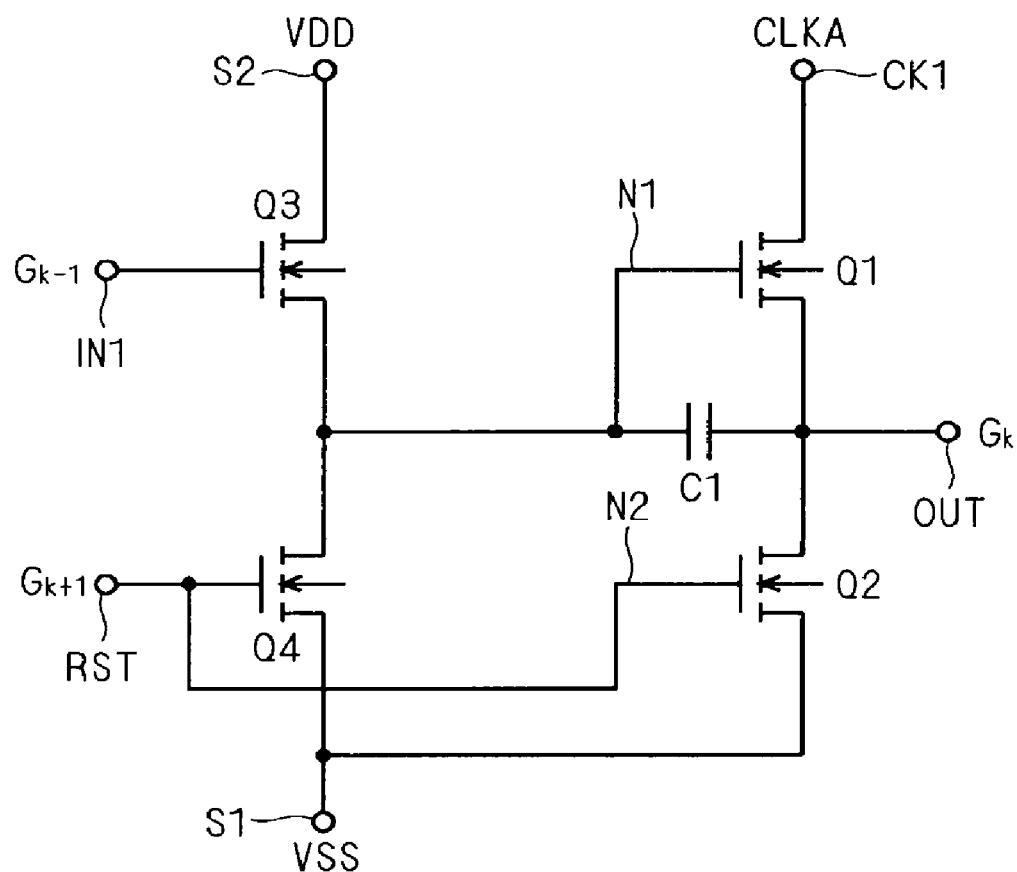
FIG. 1 is a circuit diagram showing the configuration of a conventional unit shift register.

DESCRIPTION OF THE PREFERRED
EMBODIMENTS

Preferred embodiments of the present invention will be described hereinbelow referring to the accompanied drawings. To avoid repeated and redundant description, elements having the same or equivalent functions are indicated by the same reference characters in the respective drawings.

First Preferred Embodiment

For ease of description of the present invention, a conventional shift register will be described first. Typically, the shift register has a multistage structure made up of a plurality of shift registers connected in cascade (cascade-connected). Throughout the present specification, each of the shift registers constituting the multistage shift register will be called "a unit shift register".

Figure 2:
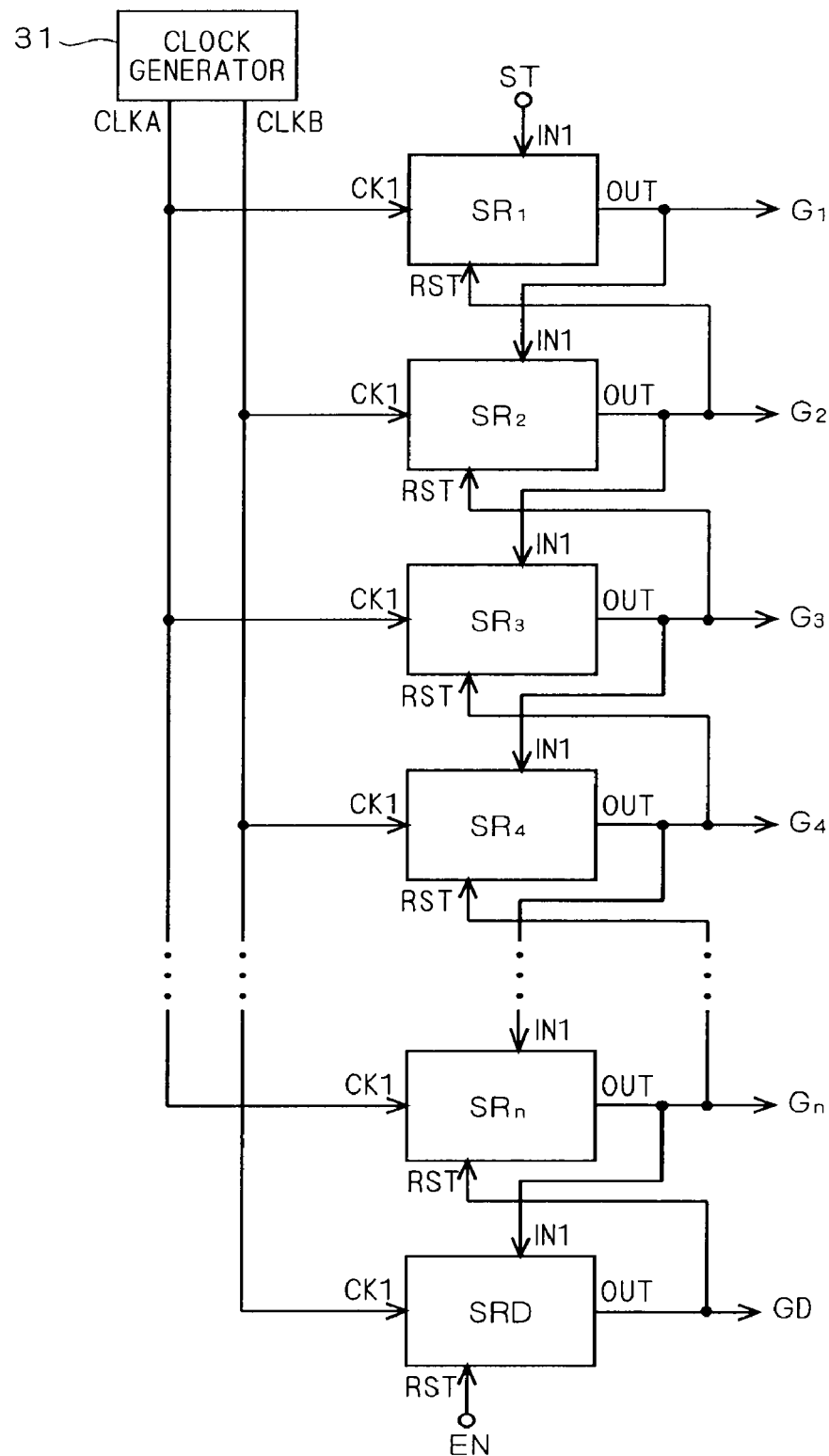
FIG. 2 shows the configuration of a multistage shift register.

As described earlier, the shift register can be used as a gate-line driving circuit of a display apparatus. A specific configuration of a display apparatus employing a shift register as the gate-line driving circuit is disclosed in, e.g., Japanese Patent Application Laid-Open No. 2006-277860 made by the inventors of the present application (FIGS. 1, 2, etc). The following description will be made assuming that the low supply voltage (VSS) as a reference potential of the circuit is 0V; in a practical display apparatus, however, a reference potential is determined with reference to a voltage of data written into pixels. For example, the low supply voltage (VSS) is set at −12V, and the high supply voltage (VDD) is set at 17V.

FIG. 1 is a circuit diagram showing the configuration of the conventional unit shift register. FIG. 2 shows the configuration of a multistage shift register. The shift register shown in FIG. 2 includes n unit shift registers $SR_1$, $SR_2$, $SR_3$, ... $SR_n$ connected in cascade and a dummy unit shift register SRD provided downstream of the unit shift register $SR_n$ of the last stage (hereinafter, the unit shift registers $SR_1$, $SR_2$, ... $SR_n$ and SRD will generically be called a "unit shift register SR"). In the conventional shift register, each of the unit shift registers SR is the circuit shown in FIG. 1.

A clock generator 31 shown in FIG. 2 is intended to supply two phase clock signals CLKA and CLKB of opposite phases to each other (whose active periods do not coincide with each other), to a plurality of unit shift registers SR. In the gate-line driving circuit, these clock signals CLKA and CLKB are controlled to be sequentially activated with timing synchronized with the scanning cycle of the display apparatus.

As shown in FIGS. 1 and 2, each unit shift register SR includes an input terminal IN1, an output terminal OUT, a clock terminal CK1 and a reset terminal RST. Each unit shift register SR receives the low supply voltage VSS (=0V) through a first power terminal S1 and the high supply voltage VDD through a second power terminal S2 (not shown in FIG. 2).

As shown in FIG. 1, the output stage of the unit shift register SR includes a transistor Q1 connected between the output terminal OUT and clock terminal CK1 and a transistor Q2 connected between the output terminal OUT and first power terminal S1. In other words, the transistor Q1 (first transistor) is intended to supply the clock signal CLKA received at the clock terminal CK1 to the output terminal OUT, and the transistor Q2 (second transistor) is intended to discharge the output terminal OUT. Hereinafter, a node to which the gate (control electrode) of the transistor Q1 is connected will be referred to as a "node N1", and a node to which the gate of the transistor Q2 is connected will be referred to as a "node N2".

A capacitive element C1 is provided between the gate and source of the transistor Q1 (i.e., between the node N1 and output terminal OUT). This capacitive element C1 is an element (bootstrap capacitance) for capacitively coupling the output terminal OUT and node N1 to raise the node N1 in voltage following the level rise at the output terminal OUT. However, the capacitive element C1 may be omitted and replaced by the gate-to-channel capacitance of the transistor Q1 when it is sufficiently large.

A transistor Q3 having its gate connected to the input terminal IN1 is connected between the node N1 and second power terminal S2. Connected between the node N1 and first power terminal S1 is a transistor Q4 having its gate connected to the reset terminal RST. That is, the transistor Q3 constitutes a charging circuit for charging the node N1 in accordance with the signal input to the input terminal IN1, and the transistor Q4 constitutes a discharging circuit for discharging the node N1 in accordance with the signal input to the reset terminal RST. In this conventional example, the gate of the transistor Q2 (node N2) is also connected to the reset terminal RST.

As shown in FIG. 2, each unit shift register SR has its input terminal IN1 connected to the output terminal OUT of a unit shift register SR of the immediately preceding stage, except that the input terminal IN1 of the unit shift register $SR_1$ of the first stage receives a predetermined start pulse ST. The clock terminal CK1 of a target unit shift register SR receives one of the clock signals CLKA and CLKB such that immediately preceding and succeeding unit shift registers SR receive clock signals of opposite phases to the target unit shift register SR, respectively.

The reset terminal RST of each unit shift register SR is connected to the output terminal OUT of a unit shift register SR of the immediately succeeding stage. However, the reset terminal RST of the dummy unit shift register SRD provided in the succeeding stage of the unit shift register $SR_n$ of the last stage receives a predetermined end pulse EN. In the gate-line driving circuit, the start pulse ST and end pulse EN are respectively input with timing corresponding to the beginning and end of each frame period of an image signal.

The operation of each conventional unit shift register SR shown in FIG. 1 will now be described. Since all of unit shift registers SR of the respective stages basically operate in the same way, the operation of the unit shift register $SR_k$ of the k-th stage of the multistage shift register will be described herein as a representative example. It is assumed that the clock terminal CK1 of the unit shift register $SR_k$ receives the clock signal CLKA (for example, the unit shift registers $SR_1$ and $SR_3$ shown in FIG. 2 correspond to this unit shift register $SR_k$).

Herein, the potential of the clock signals CLKA and CLKB at the H level is assumed to be VDD (high supply voltage), and the potential at the L level is assumed to be VSS (low supply voltage). The threshold voltage of each transistor Qx constituting the unit shift register SR shall be expressed as Vth (Qx).

Figure 3:
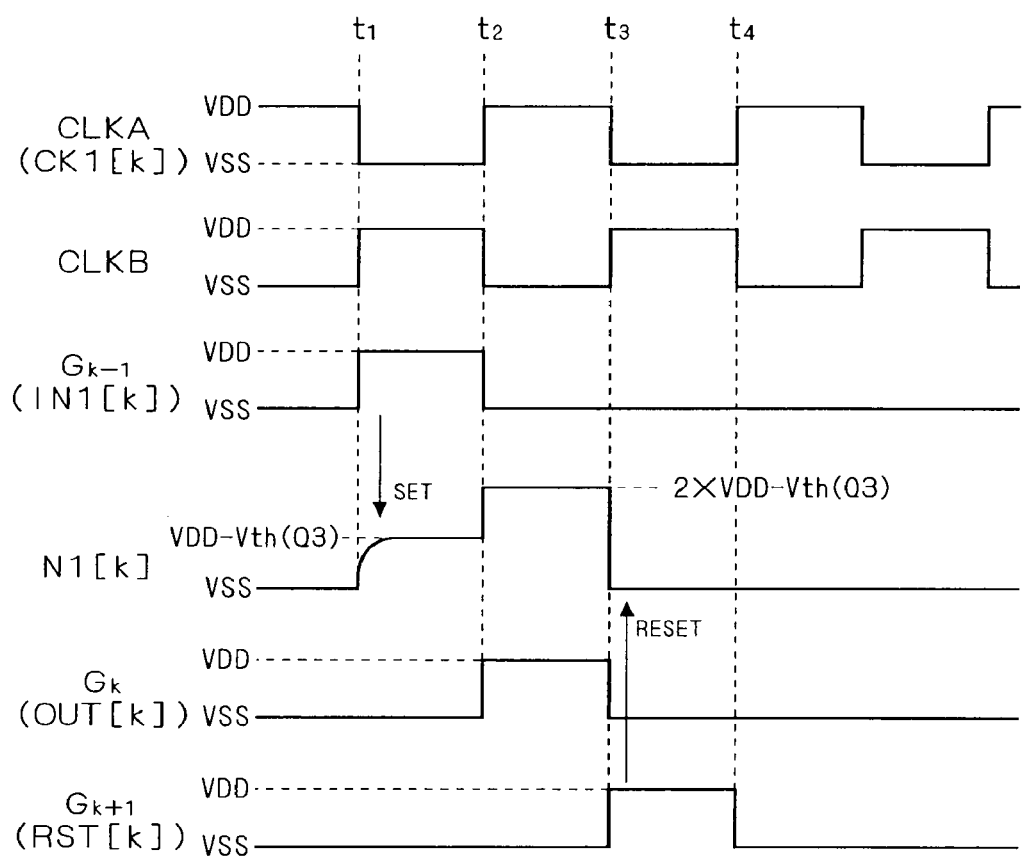
FIG. 3 is a timing chart of an operation of the conventional unit shift register.

FIG. 3 is a timing chart of an operation of the conventional unit shift register $SR_k$ (FIG. 1). In the initial state of the conventional unit shift register $SR_k$, it is assumed that the node N1 is at the L level (hereinafter, this mode where the node N1 is at the L level will be called a "reset mode"). It is also assumed that the input terminal IN1 (output signal $G_{k-1}$ from the immediately preceding stage), reset terminal RST (output signal $G_{k+1}$ from the immediately succeeding stage) and clock terminal CK1 (clock signal CLKA) are all at the L level. Since the transistors Q1 and Q2 are both off at this time, the output terminal OUT is in a high impedance state (floating state), however, it is assumed that the output terminal OUT (output signal $G_k$) is also at the L level in the initial state.

Starting from this state, when the clock signal CLKA changes to the L level, the clock signal CLKB changes to the H level, and the output signal $G_{k-1}$ from the immediately preceding stage (or the start pulse ST in the first stage) rises to the H level at time $t_1$, then, the transistor Q3 of the unit shift register $SR_k$ turns on, to charge the node N1 to reach the H level (hereinafter, such mode where the node N1 is at the H level will be called a "set mode"). At this time, the voltage level (hereinafter briefly called "level") at the node N1 rises to VDD−Vth (Q3). The transistor Q1 accordingly turns on.

At time $t_2$, the clock signal CLKB changes to the L level, the clock signal CLKA changes to the H level, and the output signal $G_{k-1}$ from the immediately preceding stage drops to the L level. Then, the transistor Q3 turns off to bring the node N1 into the floating state while being kept at the H level. Since the transistor Q1 is on, the output terminal OUT rises in level following the clock signal CLKA.

When the clock terminal CK1 and output terminal OUT rise in level, the node N1 rises in level as shown in FIG. 3 by means of the coupling through the capacitive element C1 and the gate-to-channel capacitance of transistor Q1. Since the step-up amount at this time nearly corresponds to the amplitude of the clock signal CLKA (VDD), the node N1 is raised to approximately 2×VDD−Vth (Q3).

As a result, the voltage between the gate (node N1) and source (output terminal OUT) of the transistor Q1 is kept large while the output signal $G_k$ is at the H level. That is, the on-state resistance of the transistor Q1 is kept low, causing the output signal $G_k$ to rise at high speeds following the clock signal CLKA to reach the H level. Further, since the transistor Q1 operates in a linear region (non-saturated region) at this time, the output signal $G_k$ rises to VDD equal to the amplitude of the clock signal CLKA.

The on-state resistance of the transistor Q1 is kept low when the clock signal CLKB rises to the H level and the clock signal CLKA drops to the L level at time $t_3$, causing the output signal $G_k$ to drop at high speeds following the clock signal CLKA to return to the L level.

Further, at time $t_3$, the output signal $G_{k+1}$ from the immediately succeeding stage rises to the H level, causing the transistors Q2 and Q4 of the unit shift register $SR_k$ to turn on. The output terminal OUT is thereby sufficiently discharged through the transistor Q2 to reliably drop to the L level (VSS). The node N1 is discharged by the transistor Q4 to drop to the L level. In short, the unit shift register $SR_k$ returns to the reset mode.

After the output signal $G_{k+1}$ from the immediately succeeding stage returns to the L level at time $t_4$, the unit shift register $SR_k$ is kept in the reset mode, and the output signal $G_k$ is kept at the L level until the output signal $G_{k-1}$ from the immediately preceding stage is input next.

Summarizing the above-described operation, the unit shift register $SR_k$ is kept in the reset mode and the transistor Q1 is kept off during a period in which the input terminal IN1 receives a signal (start pulse ST or output signal $G_{k-1}$ from the immediately preceding stage). The output signal $G_k$ is therefore kept at the L level (VSS). When the input terminal IN1 receives a signal, the unit shift register $SR_k$ is switched to the set mode. Since the transistor Q1 turns on in the set mode, the output signal $G_k$ rises to the H level during a period in which the signal input to the clock terminal CK1 (clock signal CLKA) is at the H level. Thereafter, when the reset terminal RST receives a signal (output signal $G_{k+1}$ from the immediately succeeding stage or end pulse EN), the original reset mode is brought about.

Figure 4:
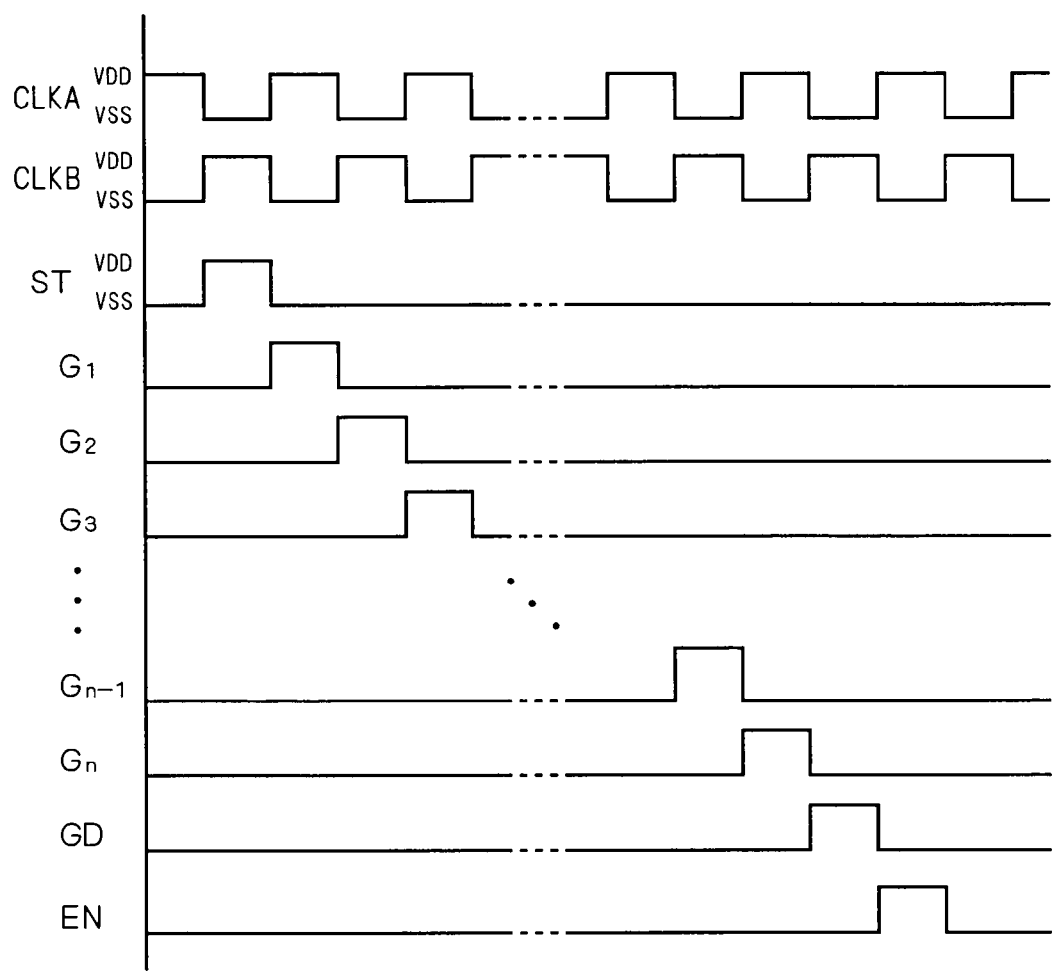
FIG. 4 shows an operation of the multistage shift register.

With the multistage shift register made up of a plurality of unit shift registers SR each operating as described above, the input of the start pulse SP to the unit shift register $SR_1$ of the first stage induces transmission of the output signal G through the unit shift registers $SR_1$, $SR_2$, $SR_3$, . . . in sequence while being shifted with timing synchronized with the clock signals CLKA and CLKB as shown in FIG. 4. In the gate-line driving circuit, the output signal G output sequentially in this manner is used as a horizontal (or vertical) scanning signal of the display panel.

A period in which a certain unit shift register SR outputs the output signal G will be called the "selected period" of that unit shift register SR.

The dummy unit shift register SRD is provided to bring the unit shift register $SR_n$ of the last stage into the reset mode by an output signal GD just after the unit shift register $SR_n$ outputs the output signal $G_n$. In the gate-line driving circuit, for example, a gate line (scanning line) corresponding to the unit shift register $SR_n$ of the last stage is unnecessarily activated unless the unit shift register $SR_n$ is brought into the reset mode just after the output signal $G_n$ is output, which causes display malfunctions.

The dummy unit shift register SRD is brought into the reset mode by the end pulse EN input with timing after the output signal GD is output. In the case where the signal shift operation is conducted repeatedly as in the gate-line driving circuit, the start pulse ST of the next frame period may be used instead of the end pulse EN.

In the driving using the two phase clock signals as shown in FIG. 2, each unit shift register SR is brought into the reset mode by the output signal G from the immediately succeeding stage, and thus can perform the normal operation as shown in FIGS. 3 and 4 only after a unit shift register SR of the immediately succeeding stage operates at least once. Therefore, a dummy operation needs to be performed prior to the normal operation, to transmit a dummy signal through the unit shift registers SR from the first to the last stages. Alternatively, a reset transistor may additionally be provided between the reset terminal RST (node N2) of each of the unit shift registers SR and second power terminal S2 (high supply voltage) to carry out a reset operation of forcedly bringing the node N2 into the H level prior to the normal operation. In that case, however, a reset signal line is additionally required.

The aforementioned drawback of negative shift of threshold voltage of a-Si transistors in the conventional unit shift register SR will now be described in detail.

As understood from the timing chart of FIG. 3, the node N1 of the unit shift register $SR_k$ is charged to the H level (VDD–Vth (Q3)) (time $t_1$) when the output signal $G_{k-1}$ from the immediately preceding stage rises to the H level, and then kept at the H level in the floating state even when the output signal $G_{k-1}$ from the immediately preceding stage returns to the L level (time $t_2$). The node N1 is raised in level up to 2×VDD–Vth (Q3) while the output signal G is at the H level (selected period: from time $t_2$ to time $t_3$).

Figure 5:
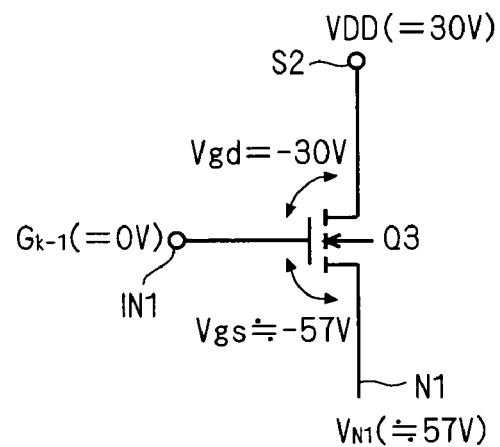
FIG. 5 shows the drawbacks of the conventional unit shift register.

That is, in the selected period of each unit shift register SR, the drain of the transistor Q3 (second power terminal S2) is at VDD, the source (node N1) is at 2×VDD–Vth (Q3), and the gate (input terminal IN1) is at VSS, where the gate is negatively biased with respect to both the source and drain. Assuming that VSS=0V and VDD=30V, for example, the gate-to-drain voltage Vgd of the transistor Q3 is approximately –30V, and gate-to-source voltage Vgs is approximately –57V, as shown in FIG. 5.

Figure 6:
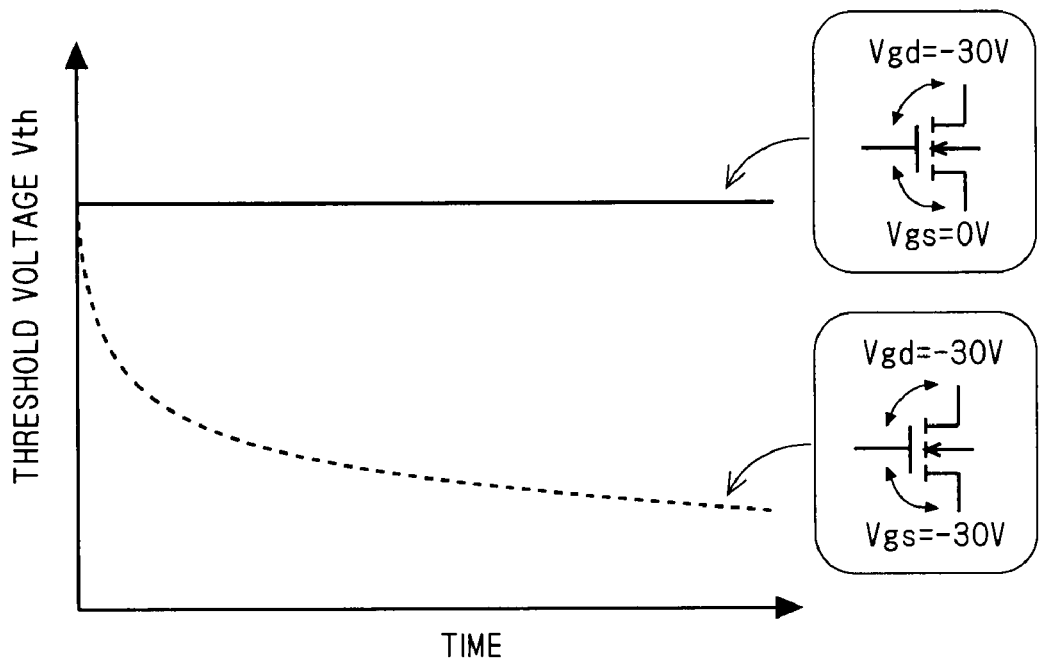
FIG. 6 shows the result of experiments indicating the relationship between the potential condition and shift of threshold voltage of a-Si transistor.

FIG. 6 shows the result of experiments indicating the relationship between the potential condition and shift of threshold voltage of a-Si transistor. As indicated by the broken line in the drawing, the threshold voltage of the a-Si transistor is shifted in the negative direction with time when the gate of the a-Si transistor becomes lower in potential than both the drain and source. Therefore, in the conventional unit shift register SR, the negative shift of threshold voltage occurs at the transistor Q3 in the selected period.

The negative shift of threshold voltage of the transistor Q3 in the unit shift register SR causes current to flow through the transistor Q3 even when the input terminal IN1 is at the L level, so that the node N1 is supplied with charges in the non-selected period to rise in level. Then, the malfunction occurs in which the transistor Q1 turns on although in the non-selected period, causing the output signal G to be output from the output terminal OUT as an error signal.

In contrast, when the gate and source are approximately equal in potential even though the gate of the a-Si transistor is lower in potential than the drain, the shift of threshold voltage is reduced. As indicated by the solid line in FIG. 6, for example, the shift of threshold voltage hardly occurs when the gate-to-source voltage is set at 0V even though the gate is lower in potential than the drain.

The shift register according to the present invention capable of solving the aforementioned problem will be described now. FIG. 7 is a circuit diagram of a unit shift register SR according to a first preferred embodiment of the present invention. The unit shift register SR includes a dual-gate transistor Q3D instead of the transistor Q3 in the circuit shown in FIG. 1. The other configuration is similar to the circuit shown in FIG. 1, and repeated description will be omitted here.

A "dual-gate transistor" mentioned in the present specification is made up of two transistors connected in series with their gates connected to each other. More specifically, the dual-gate transistor Q3D includes transistors Q3a and Q3b connected in series between the node N1 and second power terminal S2, and the transistors Q3a and Q3b have their gates both connected to the input terminal IN1. Herein, the connection node between the transistors Q3a and Q3b is defined as a "node N3".

Figure 8:
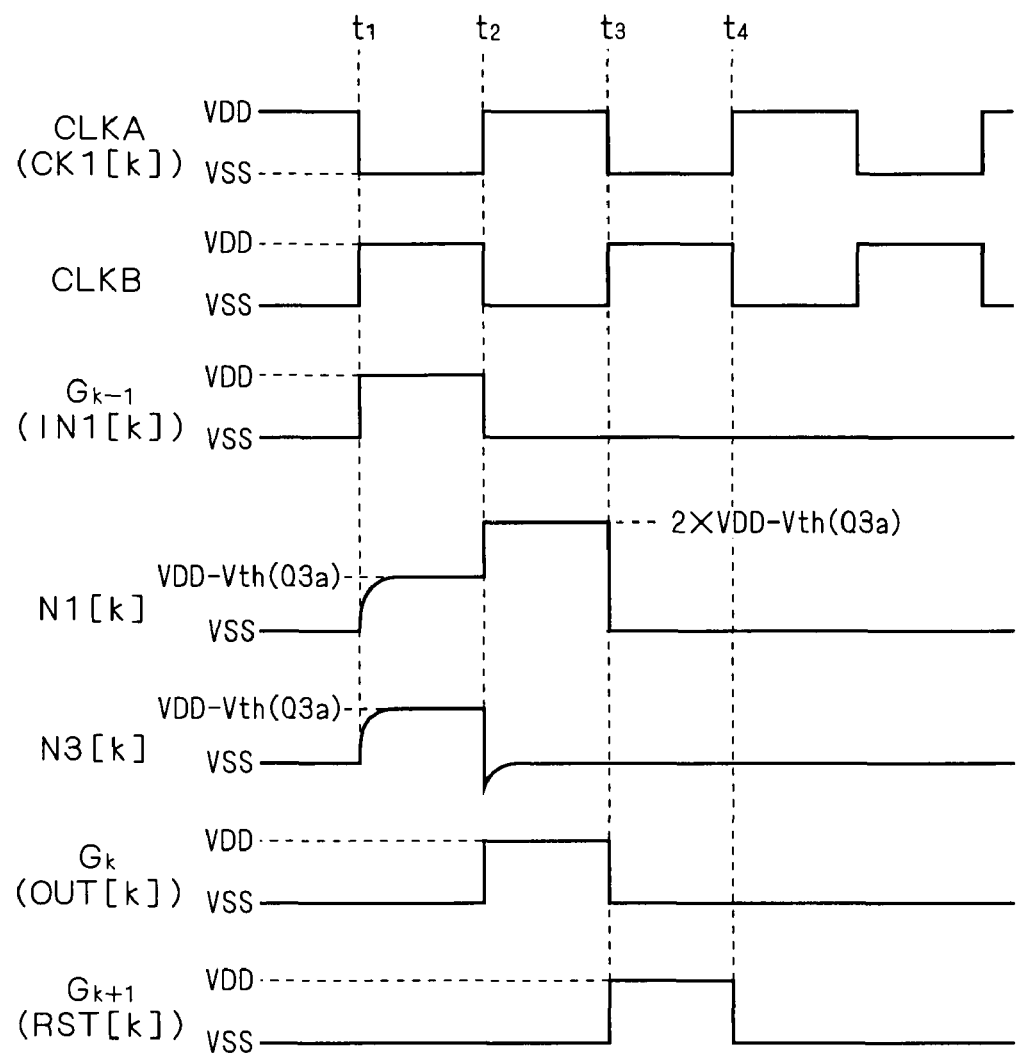
FIG. 8 is a timing chart of an operation of the unit shift register according to the first preferred embodiment.

FIG. 8 is a timing chart of an operation of the unit shift register SR shown in FIG. 7. The unit shift register $SR_k$ of the k-th stage will also be described herein as a representative example. As the initial state, it is assumed that the unit shift register $SR_k$ is in the reset mode where the node N1 is at the L level, and the clock terminal CK1 (clock signal CLKA), reset terminal RST (output signal $G_{k+1}$ from the immediately succeeding stage), input terminal IN1 (output signal $G_{k-1}$ from the immediately preceding stage) and output terminal OUT (output signal $G_k$) are all assumed to be at the L level.

Starting from this state, when the clock signal CLKA changes to the L level, the clock signal CLKB changes to the H level, and the output signal $G_{k-1}$ from the immediately preceding stage (or the start pulse ST in the first stage) rises to the H level at time $t_1$, then, the transistors Q3a and Q3b constituting the dual-gate transistor Q3D of the unit shift register $SR_k$ both turn on, to charge the node N1 to reach the H level. That is, the unit shift register $SR_k$ is brought into the set mode. At this time, the nodes N1 and N3 both rise in level to VDD–Vth (Q3a). The transistor Q1 accordingly turns on.

At time $t_2$, the clock signal CLKB changes to the L level, the clock signal CLKA changes to the H level, and the output signal $G_{k-1}$ from the immediately preceding stage drops to the L level. Then, the transistors Q3a and Q3b turn off to bring the node N1 into the floating state while being kept at the H level. The transistor Q1 is thereby kept on, and the output signal $G_k$ rises to the H level following the clock signal CLKA. At this time, the node N1 is raised to approximately 2×VDD–Vth (Q3a).

In the present embodiment, a transistor having a large gate-to-source overlap capacitance is used as each of the transistors Q3a and Q3b constituting the dual-gate transistor Q3D (the technique for increasing the gate-to-source overlap capacitance of the transistors Q3a and Q3b will be described in a ninth preferred embodiment). The parasitic capacitance between the input terminal IN1 and node N3 is therefore large, and the node N3 is pulled down to the L level (level lower than the threshold voltage of transistors Q3a and Q3b) by the coupling through that parasitic capacitance when the clock signal CLKB drops to the L level at time $t_2$. When the parasitic capacitance between the input terminal IN1 and node N3 is sufficiently large, the node N3 is pulled down to approximately VSS at time $t_2$, as shown in FIG. 8.

According to the potential relationship, the second power terminal S2 serves as the drain and the node N3 serves as the source in the transistor Q3a, and the node N1 serves as the drain and the node N3 serves as the source in the transistor Q3b.

Then, when the clock signal CLKB changes to the H level and the clock signal CLKA changes to the L level at time $t_3$, the output signal $G_k$ returns to the L level. At the same time, the output signal $G_{k+1}$ from the immediately succeeding stage rises to the H level, causing the transistors Q2 and Q4 of the unit shift register $SR_k$ to turn on, so that the unit shift register $SR_k$ returns to the reset mode.

After the output signal $G_{k+1}$ from the immediately succeeding stage drops to the L level at time $t_4$, the unit shift register $SR_k$ is kept in the reset mode and the output signal $G_k$ is kept at the L level until the output signal $G_{k-1}$ from the immediately preceding stage is input next.

As described above, the signal shift operation of the unit shift register SR according to the present embodiment is almost similar to that of the conventional one (FIG. 1), and a multistage shift register made up of such unit shift registers is capable of carrying out the operation as described with reference to FIG. 4.

In the present embodiment, the node N3 is pulled down to the L level in accordance with the falling of the output signal $G_{k-1}$ from the immediately preceding stage at time $t_2$, as described above. Therefore, from time $t_2$ to time $t_3$ (in the selected period), the transistor Q3a is in the condition where the gate (input terminal IN1) and source (node N3) are at VSS and the drain (second power terminal S2) is at VDD, while the transistor Q3b is in the condition where the gate (input terminal IN1) and source (node N3) are at VSS and the drain (node N1) is at 2×VDD−Vth (Q3a).

Figure 9:
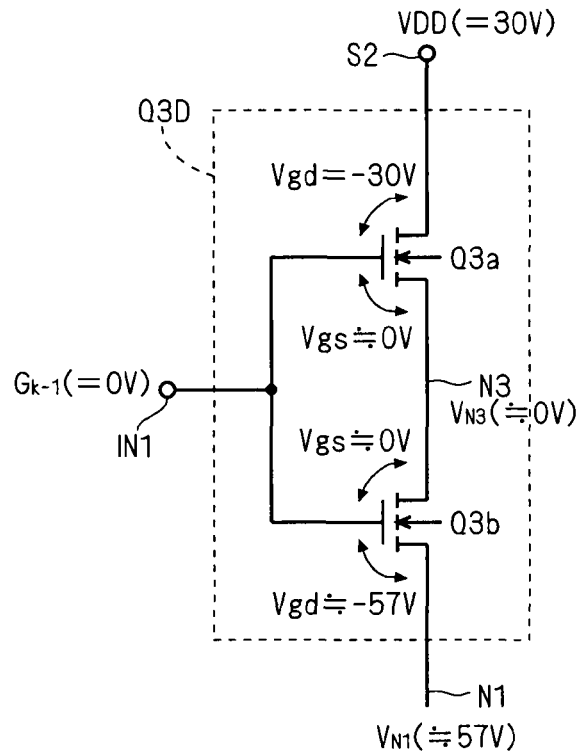
FIGS. 9 and 10 show the effects of the first preferred embodiment.

That is, in the unit shift register SR according to the present embodiment, the gate-to-source voltage of each of the transistors Q3a and Q3b is approximately 0V in the selected period. Assuming that VSS=0V and VDD=30V, for example, the transistor Q3a has a gate-to-drain voltage Vgd of approximately −30V and a gate-to-source voltage Vgs of approximately 0V while the transistor Q3ba has a gate-to-drain voltage Vgd of approximately −57V and a gate-to-source voltage Vgs of approximately 0V, as shown in FIG. 9.

As indicated by the solid line in FIG. 6, the shift of threshold voltage in the a-Si transistor hardly occurs when the gate has an almost equal potential to the source (i.e., the gate-to-source voltage is approximately 0V) even though the gate is lower in potential than the drain. Therefore, in the unit shift register SR according to the present embodiment, the negative shift of threshold voltage in the transistors Q3a and Q3b, i.e., dual-gate transistor Q3D does not occur. This prevents current from flowing through the dual-gate transistor Q3D in the non-selected period to raise the node N1 in level, thereby preventing the occurrence of malfunctions.

The condition that the gate-to-source voltage of each of the transistors Q3a and Q3b be 0V or below in the non-selected period of the unit shift register SR (i.e., the condition that the node N3 is pulled down to VSS or below) will now be described. Herein, it is also assumed that VSS is 0V. That is, the amplitude of output signal G of unit shift register SR (difference (Vd) between the H and L levels) is VDD. Expressing the capacitive element (C1) between the input terminal IN1 and node N3 as Cgs and the parasitic capacitance (C2) accompanied with the node N3 not contained in Cgs as Cstr, the amount of change in level at the node N3 of the unit shift register $SR_k$ when the output signal $G_{k-1}$ from the immediately preceding stage changes from the H level (VDD) to the L level (VSS=0V) at time $t_2$ shown in FIG. 8 is expressed as VDD×Cgs/(Cgs+Cstr). Since the node N3 is at VDD−Vth (Q3a) just before time $t_2$, the following expression (1) should be satisfied in order to pull down the node N3 to VSS or below:

$$\frac{Cgs}{Cgs + Cstr} \times VDD \geq VDD - Vth \quad (1)$$

$$\therefore Cgs \geq \frac{Cstr \times \{VDD - Vth(Q3a)\}}{Vth(Q3a)}$$

Figure 10:
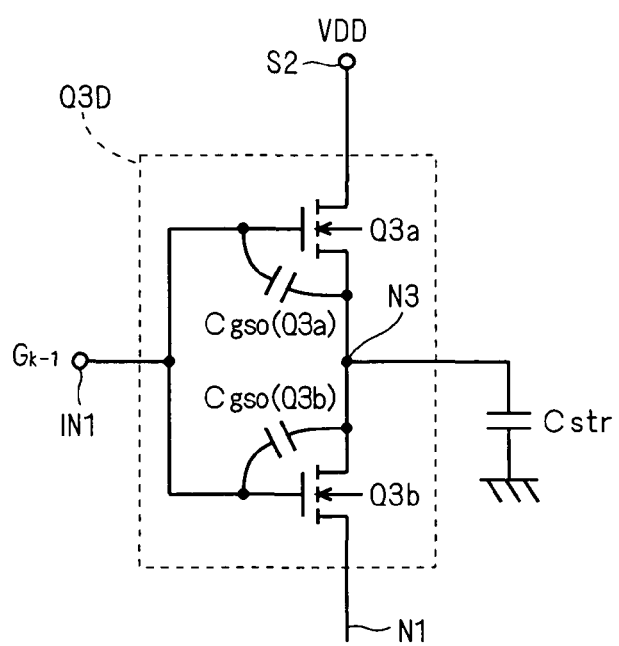

In the unit shift register SR according to the present embodiment, the capacitive component Cgs is the parasitic capacitance between the input terminal IN1 and node N3, and the most part thereof is the gate-to-source overlap capacitances of the transistors Q3a and Q3b. Therefore, as shown in FIG. 10, expressing the gate-to-source overlap capacitances of the transistors Q3a and Q3b as Cgso (Q3a) and Cgso (Q3b), respectively, the relation Cgs≈Cgso (Q3a)+Cgso (Q3b) holds, and the above expression (1) can be replaced by the following expression (2):

$$\frac{Cgso(Q3a) + Cgso(Q3b)}{Cgso(Q3a) + Cgso(Q3b) + Cstr} \times VDD \geq VDD - Vth(Q3a) \quad (2)$$

$$\therefore Cgso(Q3a) + Cgso(Q3b) \geq \frac{Cstr \times \{VDD - Vth(Q3a)\}}{Vth(Q3a)}$$

Further, assuming that the transistors Q3a and Q3b have an equal gate-to-source overlap capacitance expressed as Cgso, the relation Cgs≈2×Cgso holds. Accordingly, the expression (1) can be replaced by the following expression (3):

$$\frac{2 \times Cgso}{2 \times Cgso + Cstr} \times VDD \geq VDD - Vth(Q3a) \quad (3)$$

$$\therefore Cgso \geq \frac{Cstr \times \{VDD - Vth(Q3a)\}}{2 \times Vth(Q3a)}$$

The present embodiment has described the configuration in which two transistors having their gates connected to the input terminal IN1 are connected in series between the node N1 and second power terminal S2, however, three or more transistors may be connected in series. In that case, each connection node between those transistors drops to VSS or below in the non-selected period if the condition of expression (1) is satisfied in each connection node, which prevents the negative shift of threshold voltage of each transistor.

Further, the present embodiment has described the example in which the dual-gate transistor according to the present invention is applied to a shift register, however, the dual-gate transistor may be widely applied to a transistor that operates such that the gate is negatively biased with respect to both the source and drain. Furthermore, the present invention may be applied not only to an a-Si transistor but also to various types of transistors having the problem of negative shift of threshold voltage, such as organic transistor.

Second Preferred Embodiment

A specific example of a shift register to which the dual-gate transistor according to the present invention may be applied will be described.

Figure 11:
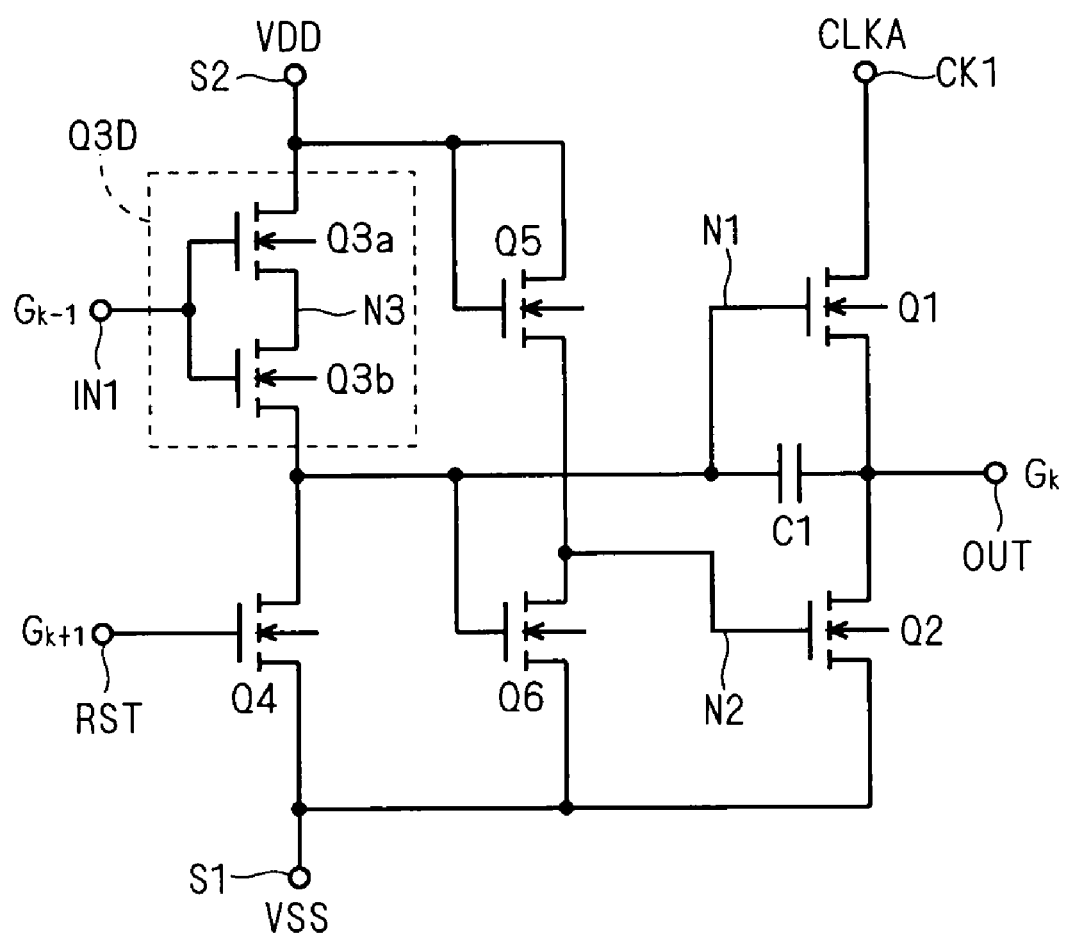
FIG. 11 is a circuit diagram of a unit shift register according to a second preferred embodiment of the present invention.

FIG. 11 is a circuit diagram of a unit shift register SR according to a second preferred embodiment. The unit shift register SR includes an inverter added to the circuit shown in FIG. 7, where the node N1 (gate of transistor Q1) serves as its input node and the node N2 (gate of transistor Q2) serves as its output node. That is, the gate of the transistor Q2 (node N2) is not connected to the reset terminal RST, unlike the circuit shown in FIG. 7.

The inverter is made up of a transistor Q5 diode-connected between the node N2 and second power terminal S2 and a transistor Q6 connected between the node N2 and first power terminal S1 having its gate connected to the node N1. The on-state resistance of the transistor Q6 is set sufficiently smaller than that of the transistor Q5.

Since the transistor Q6 turns off when the node N1 is at the L level, the node N2 rises to the H level (VDD−Vth (Q5)). Conversely, the transistors Q5 and Q6 both turn on when the node N1 is at the H level, but the node N2 is at the L level (z 0V) determined by the ratio between the on-state resistances of the transistors Q5 and Q6. In short, the inverter is so-called "ratio inverter".

In the unit shift register $SR_k$ shown in FIG. 7, the node N2 rises to the H level only when the output signal $G_{k+1}$ from the immediately succeeding stage rises to the H level (i.e., in the selected period of the succeeding stage), so that the transistor Q2 turns on only in that period, bringing the output terminal OUT into the L level with low impedance. In the other non-selected period, the transistor Q2 is off, and the output terminal OUT is at the L level with high impedance (floating state). Therefore, the output signal $G_k$ is susceptible to noise or leak current, which is likely to unstabilize the operation.

In contrast, in the unit shift register $SR_k$ shown in FIG. 11, the inverter made up of the transistors Q5 and Q6 maintains the node N2 at the H level while the node N1 is at the L level. Thus, the transistor Q2 is kept off throughout the non-selected period. In other words, the output terminal OUT (output signal G) is kept at the L level with low impedance in the non-selected period, which stabilizes the operation.

Of course, the present embodiment also achieves the effect of suppressing the negative shift of threshold voltage of the transistors Q3$a$ and Q3$b$ constituting the dual-gate transistor Q3D. This prevents the node N1 from rising in level in the non-selected period, which prevents the occurrence of malfunctions.

Third Preferred Embodiment

FIG. 12 is a circuit diagram of a unit shift register SR according to a third preferred embodiment. The unit shift register SR includes a transistor Q7 having its gate connected to the node N2 additionally provided between the node N1 and first power terminal S1 in the circuit shown in FIG. 11. That is, the transistor Q7 has a gate electrode connected to the node N2 and is intended to discharge the node N1.

In the unit shift register $SR_k$ shown in FIG. 11, the transistor Q4 turns on to discharge the node N1 when the output signal $G_{k+1}$ from the immediately succeeding stage rises to the H level (in the selected period of the succeeding stage), but the node N1 is at the L level with high impedance (floating state) in the other non-selected period. The node N1 therefore rises in level when supplied with charges by noise or leak current in the non-selected period. Then, the malfunction occurs in which the transistor Q1 turns on and output signal G is output as an error signal.

In contrast, in the unit shift register SR shown in FIG. 12, the inverter made up of the transistors Q5 and Q6 raises the node N2 to the H level when the node N1 drops to the L level, causing the transistor Q7 to turn on accordingly. Thus, the node N1 is at the L level with low impedance throughout the non-selected period. This means that the node N1 is prevented from rising in level in the non-selected period, which prevents the occurrence of malfunctions.

The on-state resistance of the transistor Q7 is set sufficiently larger than that of the dual-gate transistor Q3D such that the dual-gate transistor Q3D can raise the node N1 in level.

The present embodiment also achieves the effect of suppressing the negative shift of threshold voltage of the transistors Q3$a$ and Q3$b$ constituting the dual-gate transistor Q3D. In the present embodiment, even if current flows through the dual-gate transistor Q3D in the non-selected period to supply charges to the node N1, the charges are discharged by the transistor Q7 to the first power terminal S1, which is less likely to cause malfunctions. However, the current causes an increase in consumption power of the unit shift register SR or degradation in high supply power VDD. It is therefore very advantageous in the present embodiment as well to prevent the negative shift of threshold voltage of the dual-gate transistor Q3D.

Fourth Preferred Embodiment

In the non-selected period in the unit shift registers SR shown in FIGS. 11 and 12 as described in the second and third preferred embodiments, the gate of the transistor Q2 (node N2) is continuously kept at the H level in the non-selected period, so that the output terminal OUT can be brought into the L level with low impedance. However, when the gate of the a-Si transistor is continuously positive-biased relative to the source, the threshold voltage is shifted in the positive direction. When the positive shift of threshold voltage occurs in the transistor Q2, the problem occurs in that the on-state resistance of the transistor Q2 increases, thus failing to bring the output terminal OUT into the L level sufficiently.

In the unit shift register SR shown in FIG. 12, the gate of the transistor Q7 is also continuously at the H level in the non-selected period, which also arises the problem in that the threshold voltage of the transistor Q7 is shifted in the positive direction, thus failing to bring the node N1 into the L level sufficiently.

Figure 13:
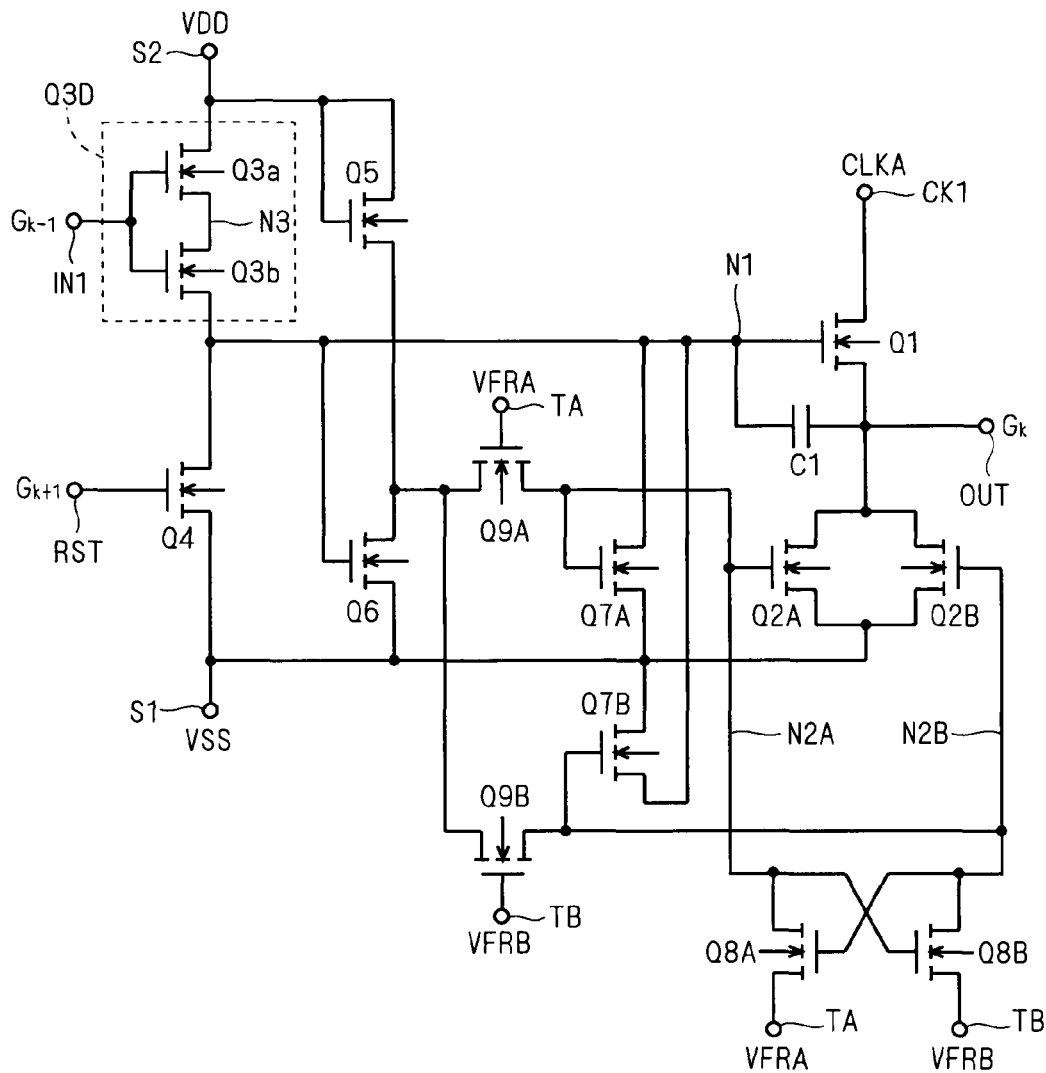
FIG. 13 is a circuit diagram of a unit shift register according to a fourth preferred embodiment of the present invention.

FIG. 13 is a circuit diagram of a unit shift register SR according to a fourth preferred embodiment having taken measures against the above-described problems. The unit shift register SR shown in FIG. 13 includes two transistors (Q2A and Q2B; corresponding to the transistor Q2 shown in FIGS. 11 and 12) provided in parallel, each of which is intended to discharge the output terminal OUT. Herein, the nodes to which the gates of the transistors Q2A and Q2B are connected are defined as a "node N2A" and a "node N2B", respectively.

In the unit shift register SR, transistors Q7A and Q7B corresponding to the transistor Q7 shown in FIG. 12 are provided for the nodes N2A and N2B, respectively. More specifically, the transistor Q7A has its gate electrode connected to the node N2A and is intended to discharge the node N1, and the transistor Q7B has its gate electrode connected to the node N2B and is intended to discharge the node N1.

The unit shift register SR according to the present embodiment includes a first control terminal TA supplied with a predetermined control signal VFRA and a second control terminal TB supplied with a control signal VFRB. The control signals VFRA and VFRB are complementary to each other, and are generated by a controller (not shown) provided outside the shift register. These control signals VFRA and VFRB are preferably controlled to change in level (alternate) in a blanking period between frames of a display image, and for example, change in level per frame of a display image.

A transistor Q8A is connected between the first control terminal TA and node N2A, and a transistor Q8B is connected between the second control terminal TB and node N2B. The transistor Q8A has its gate connected to the node N2B, and the transistor Q8B has its gate connected to the node N2A. In other words, the transistors Q8A and Q8B constitute what is called a flip-flop circuit each having one main electrode (herein, drain) connected to the control electrode (gate) of each other in a crossed manner.

The unit shift register SR also includes a transistor Q9A connected between the output node of the inverter formed of the transistors Q5 and Q6 and node N2A, and a transistor Q9B connected between the output node of the inverter and node N2B. The transistor Q9A has its gate connected to the first control terminal TA, and the transistor Q9B has its gate connected to the second control terminal TB.

During a period in which the control signal VFRA is at the H level and the control signal VFRB is at the L level, the transistor Q9A is on and the transistor Q9B is off, causing the output node of the inverter formed of the transistors Q5 and Q6 to be connected to the node N2A. At this time, the transistor Q8B turns on, bringing the node N2B into to the L level. In other words, in that period, the transistor Q2A is driven, and the transistor Q2B is deactivated.

Conversely, during a period in which the control signal VFRA is at the L level and the control signal VFRB is at the H level, the transistor Q9A is off and the transistor Q9B is on, causing the output node of the inverter formed of the transistors Q5 and Q6 to be connected to the node N2B. At this time, the transistor Q8A turns on, bringing the node N2A into to the L level. In other words, in that period, the transistor Q2B is driven, and the transistor Q2A is deactivated.

In this manner, the transistors Q9A and Q9B serve as a switching circuit for connecting the output node of the inverter formed of the transistors Q5 and Q6 alternately to the nodes N2A and N2B on the basis of the control signals VFRA and VFRB.

In the present embodiment, the pair of the transistors Q2A and Q5A and the pair of the transistors Q2B and Q5B are alternately deactivated every time the control signals VFRA and VFRB are inverted in level, which prevents the gates of these transistors from being continuously biased. This can prevent malfunctions due to the positive shift of threshold voltage of a-Si transistors, which achieves improved operational reliability.

The present embodiment also achieves the effect of suppressing the negative shift of threshold voltage of the transistors Q3*a* and Q3*b* constituting the dual-gate transistor Q3D. This prevents the occurrence of malfunctions of the unit shift register SR, increase in consumption power, and reduction in power supply voltage.

Fifth Preferred Embodiment

In the above-described preferred embodiments, the dual-gate transistor Q3D operates in a source-follower mode when the node N1 of the unit shift register SR is charged. More specifically, as charging of the node N1 progresses, the voltage between the gate (input terminal IN1) and source (node N1) of the transistor Q3*b* decreases, which degrades the driving capability (current-flowing capability). This requires a certain amount of time to charge the node N1 to a sufficiently high level, which interferes with the speeding up of operation of the shift register.

Figure 15:
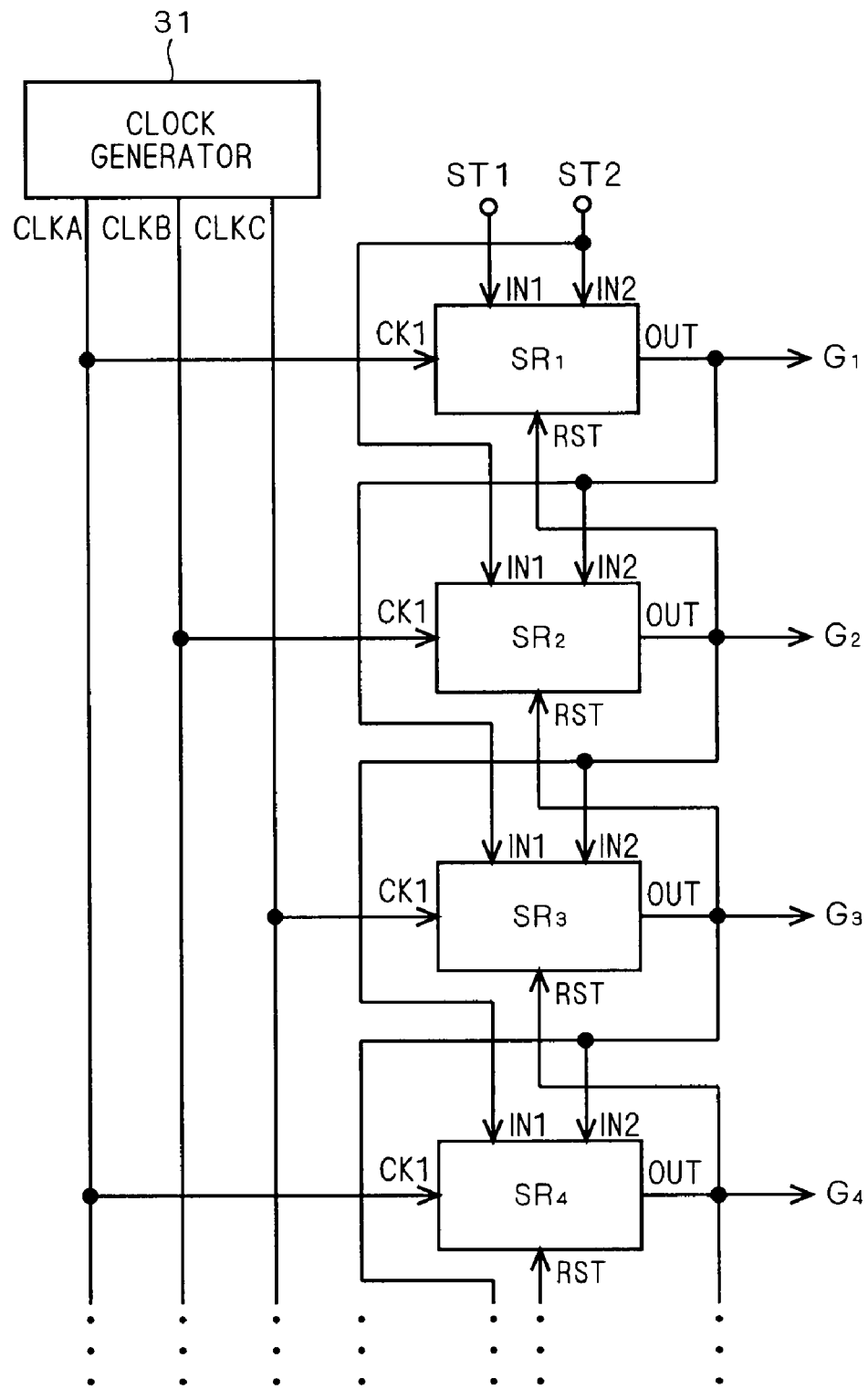
FIG. 15 shows the configuration of a multistage shift register made up of unit shift registers according to the fifth preferred embodiment.

FIG. 14 is a circuit diagram of a unit shift register SR according to the fifth preferred embodiment having taken measures against the above-described problems. Unit shift registers SR, when connected in cascade, are each operated using three phase clock signals CLKA, CLKB and CLKC shifted in phase with one another, as shown in FIG. 15.

Each unit shift register SR includes two input terminals, i.e. first input terminal IN1 and second input terminal IN2, and the first input terminal IN1 is connected to the output terminal OUT of the second preceding stage, and the second input terminal IN2 is connected to the output terminal OUT of the immediately preceding stage. The first and second input terminals IN1 and IN2 of the unit shift register SRI of the first stage are supplied with start pulses ST1 and ST2, respectively. The start pulses ST1 and ST2 are activated (brought into the H level) with different timing from each other, and the start pulse ST2 is activated after the start pulse ST1.

As means for charging the node N1, the unit shift register SR according to the present embodiment includes the dual-gate transistor Q3D, a transistor Q10 for charging the gate node of the dual-gate transistor Q3D (defined as a "node N4"), a capacitive element C2 for raising (stepping up) the node N4 in level, and the transistor Q4 for discharging the node N4. As shown in FIG. 14, the transistor Q10 is connected between the node N4 and second power terminal S2, and has its gate connected to the first input terminal IN1. The capacitive element C2 is connected between the node N4 and second input terminal IN2. The transistor Q4 is connected between the node N4 and first power terminal S1, and has its gate connected to reset terminal RST.

The unit shift register SR includes an inverter (transistors Q5 and Q6) with the node N4 serving as its input node, and the gates (node N2) of the transistors Q2 and Q7 discharging the output terminal OUT and node N1, respectively, are both connected to the output node of that inverter. A transistor Q11 is further connected between the node N4 and first power terminal S1 in parallel to the transistor Q4, and has its gate connected to the node N2.

The unit shift register SR shown in FIG. 14 basically operates based on almost the same theory as the unit shift register SR described in the first preferred embodiment, but is characterized in that the gate of the dual-gate transistor Q3D for charging the node N1 is charged and raised in level using two signals, i.e., output signals from the immediately preceding stage and second preceding stage.

More specifically, in the unit shift register $SR_k$, the gate of the dual-gate transistor Q3D (node N4) is precharged to the level of VDD−Vth (Q10) by the transistor Q10 when the output signal $G_{k-2}$ from the second preceding stage rises to the H level. Then, when the output signal $G_{k-1}$ from the immediately preceding stage rises to the H level, the node N4 is raised to approximately 2×VDD−Vth (Q10) by the capacitive element C2. That is, the dual-gate transistor Q3D has a higher gate potential by approximately VDD than the circuit shown in FIG. 1, and is therefore capable of charging the node N1 by the operation in the non-saturation region, not in the source-follower mode. The node N1 is thereby charged at high speeds to be brought into the H level (VDD), which solves the aforementioned problems.

In the present embodiment, the transistor Q4 controlled by the output signal $G_{k+1}$ from the immediately succeeding stage is used for discharging the node N4 (which differs from the transistor Q4 shown in FIG. 7 in this respect) since the gate of the dual-gate transistor Q3D (node N4) is in the floating state in the selected period. When the transistor Q4 brings the node N4 into the L level, the inverter formed of the transistors Q5 and Q6 brings the node N2 into the H level, which accordingly causes the transistor Q7 to turn on to discharge the node N1. That is, in the present embodiment, the transistor Q7 serves to discharge the node N1 in accordance with the signal input to the reset terminal RST (i.e., the role of transistor Q4 in FIG. 7).

The transistor Q11 operates to keep the node N4 at the L level with low impedance while the node N2 is at the H level (non-selected period), which prevents the unit shift register SR from malfunctioning.

The present embodiment also achieves the effect of suppressing the negative shift of threshold voltage of the transistors Q3a and Q3b constituting the dual-gate transistor Q3D. This prevents the occurrence of malfunctions of the unit shift register SR, increase in consumption power, and reduction in power supply voltage.

In the unit shift register SR shown in FIG. 14, the gate of the transistor Q10 has a lower potential than the source and drain when the output signal $G_{k-2}$ from the second preceding stage drops to the L level after the transistor Q10 charges the node N4. This may arise the problem of negative shift of threshold voltage in the transistor Q10 as well, similarly to the transistor Q3 shown in FIG. 1.

In order to avoid the problem, the dual-gate transistor according to the present invention may also be applied to the transistor Q10 shown in FIG. 14. More specifically, the transistor Q10 may be replaced by a transistor Q10D formed of transistors Q10a and Q10b, as shown in FIG. 16. Similarly to the above-described transistor Q3D, the dual-gate transistor Q1OD also has a large parasitic capacitance between its gate and the connection node between the transistors Q10a and Q10b (defined as a "node N10") such that the node N10 drops to the L level in accordance with the change from the H level to the L level of the gate electrode.

Such configuration achieves the effect of suppressing the negative shift of threshold voltage in the dual-gate transistor Q10D, i.e., transistors Q10a and Q10b. This prevents the occurrence of malfunctions of the unit shift register SR of the present embodiment, increase in consumption power, and reduction in power supply voltage.

Sixth Preferred Embodiment

The fourth preferred embodiment has described one of techniques for solving the problem of positive shift of threshold voltage in the transistors Q2 and Q7 intended to bring the output terminal OUT and node N1, respectively, into the L level with low impedance in the non-selected period. The present embodiment will describe another technique for solving the problem.

FIG. 17 is a circuit diagram of a unit shift register SR according to the sixth preferred embodiment. The unit shift register SR includes two clock terminals, i.e., the first clock terminal CK1 connected to the drain of the transistor Q1, and a second clock terminal CK2 supplied with a clock signal of different phase from the signal supplied to the first clock terminal CK1.

A transistor Q12 having its gate connected to the first clock terminal CK1 is provided between the node N1 and output terminal OUT, and a transistor Q13 having its gate connected to the first clock terminal CK1 is provided between the output node (defined as a "node N5") of the inverter formed of the transistors Q5 and Q6 and the first power terminal S1. Further, in the present embodiment, the transistor Q2 connected between the output terminal OUT and first power terminal S1 has its gate connected to the second clock terminal CK2.

While the node N1 serves as the input node of the inverter formed of the transistors Q5 and Q6 similarly to the second and third preferred embodiments, the inverter differs from that of the second and third preferred embodiments in that the transistor Q5 has its gate and drain connected to the second clock terminal CK2. In other words, the clock signal input to the second clock terminal CK2 serves as the power supply of the inverter.

The unit shift register SR shown in FIG. 17 basically operates based on almost the same theory as the unit shift register SR described in the first preferred embodiment, but is characterized in that the inverter formed of the transistors Q5 and Q6 is activated by the power supply of the clock signal input to the second clock terminal CK2, and the output of the inverter is forcedly brought into the L level by the transistor Q13.

Herein, the unit shift register $SR_k$ of the k-th stage will also be described as a representative example. For ease of description, it is assumed that, in the unit shift register $SR_k$, the first clock terminal CK1 receives the clock signal CLKA and the second clock terminal CK2 receives the clock signal CLKB.

First, the operation of the unit shift register $SR_k$ in the non-selected period will be described. Since the node N1 is at the L level in the non-selected period, the node N5 rises to the H level when the inverter formed of the transistors Q5 and Q6 is activated by the clock signal CLKB. When the inverter is deactivated, the transistor Q13 turns on in accordance with the clock signal CLKA, bringing the node N5 into the L level. That is, the node N5 changes in level almost in the same way as the clock signal CLKB in the non-selected period. Therefore, the transistor Q7 brings the node N1 into the L level with low impedance with timing when the clock signal CLKB rises to the H level.

While the transistor Q7 turns off when the clock signal CLKB is at the L level, the clock signal CLKA turns the transistor Q12 on in that period, so that charges at the node N1 are discharged to the output terminal OUT by the transistor Q12. Since a capacitive load (a gate line of a display panel in the case of a gate-line driving circuit) is typically connected to the output terminal OUT, the output terminal OUT will not be brought into the H level with such amount of charges that is discharged to the output terminal OUT at this time.

In this manner, the transistors Q7 and Q12 operate to alternately discharge the node N1 in the non-selected period of the unit shift register $SR_k$, thereby preventing the node N1 from rising in level. Since the gate electrodes of the transistors Q7 and Q12 are not continuously positive-biased, the positive shift of their threshold voltages is suppressed.

The transistor Q2 turns on when the clock signal CLKB rises to the H level, bringing the output terminal OUT into the L level with low impedance. That is, since the gate electrode of the transistor Q2 is not continuously positive-biased, the positive shift of threshold voltage is suppressed.

The node N1 rises to the H level when the output signal $G_{k-1}$ from the immediately preceding stage rises to the H level to bring the unit shift register $SR_k$ into the selected period. In that period, the node N5 is at the L level while the inverter formed of the transistors Q5 and Q6 is activated by the clock signal CLKB, causing the transistor Q7 to turn off to keep the node N1 at the H level. Then, when the clock signal CLKA rises to the H level, the gate of the transistor Q12 rises to the H level, but the output terminal OUT (output signal $G_k$) also rises to the H level at this time. Therefore, the transistor Q12 does not turn on, so that the node N1 is kept at the H level in the floating state (raised in level by the clock signal CLKA). The unit shift register $SR_k$ can thereby output the output signal $G_k$ normally.

As described above, in the unit shift register SR according to the present embodiment, the node N1 changes in level similarly to the first preferred embodiment. More specifically, the unit shift register SR operates to keep the reset mode in the non-selected period and to be brought into the set mode in the selected period. The unit shift register SR can thereby perform a shift operation similarly to the first preferred embodiment.

While the source of the transistor Q2 is connected to the first power terminal S1 in the above description, it may be connected to the first clock terminal CK1. In that case, the clock signal CLKA input to the source rises to the H level when the clock signal CLKB input to the gate of the transistor Q2 drops to the L level to turn off the transistor Q2, which brings a state equivalent to that the gate of the transistor Q2 is negatively biased to the source. Accordingly, the threshold voltage shifted in the positive direction returns in the negative direction to be recovered, suppressing the degradation in driving capability of the transistor Q2, which brings the effect of increasing the operating life of the circuit.

The present embodiment also achieves the effect of suppressing the negative shift of threshold voltage of the transistors Q3a and Q3b constituting the dual-gate transistor Q3D. This prevents the occurrence of malfunctions of the unit shift register SR, increase in consumption power, and reduction in power supply voltage.

Seventh Preferred Embodiment

The present embodiment will also describe a technique for solving the problem of positive shift of threshold voltage in the transistors Q2 and Q7 intended to bring the output terminal OUT and node N1, respectively, into the L level with low impedance in the non-selected period.

FIG. 18 is a circuit diagram of a unit shift register SR according to the seventh preferred embodiment. The unit shift register SR includes the first clock terminal CK1 connected to the drain of the transistor Q1 and second clock terminal CK2 supplied with a clock signal of different phase from the signal supplied to the first clock terminal CK1.

The circuit shown in FIG. 18 has a similar configuration to that of the circuit shown in FIG. 12, but differs in that the inverter with the gate node of the transistor Q1 (node N1) serving as its input node and the gate node of the transistor Q2 (node N2) serving as its output node is a capacitive load inverter. More specifically, the inverter includes a loading capacitor C3 as a loading element. The inverter differs from typical inverters in that the clock signal input to the first clock terminal CK1 serves as the power supply. That is, the loading capacitor C3 is connected between the node N2 serving as the output node of the inverter and the first clock terminal CK1. The loading capacitor C3 serves not only as the loading element of the inverter, but also as coupling capacitance between the first clock terminal CK1 and node N2.

The circuit shown in FIG. 18 further includes a transistor Q14 connected in parallel to the transistor Q2 having its gate connected to the output node of the inverter. The transistor Q14 has its gate connected to the second clock terminal CK2.

The unit shift register SR shown in FIG. 18 basically operates based on almost the same theory as the unit shift register SR described in the first preferred embodiment, but is characterized in that the inverter formed of the loading capacitor C3 and transistor Q6 is activated by the power supply of the clock signal input to the first clock terminal CK1.

Herein, the unit shift register $SR_k$ of the k-th stage will also be described as a representative example. For ease of description, it is assumed that, in the unit shift register $SR_k$, the first clock terminal CK1 receives the clock signal CLKA and the second clock terminal CK2 receives the clock signal CLKB.

First, the operation of the unit shift register $SR_k$ in the non-selected period will be described. Since the node N1 is at the L level in the non-selected period, the node N2 rises to the H level when the inverter formed of the loading capacitor C3 and transistor Q6 is activated by the clock signal CLKA. When the inverter is deactivated, the node N2 drops to the L level in accordance with the falling of the clock signal CLKA because of the coupling through the loading capacitor C3. That is, the node N2 changes in level in the non-selected period almost in the same way as the clock signal CLKA. Accordingly, the transistor Q7 brings the node N1 into the L level with low impedance with timing when the clock signal CLKA rises to the H level.

The transistor Q2 also turns on with timing synchronized with the clock signal CLKA, similarly to the transistor Q7, to thereby bring the output terminal OUT into the L level with low impedance. When the clock signal CLKA is at the L level, the transistor Q2 turns off, but the transistor Q14 turns on at this time in accordance with the clock signal CLKB to keep the output terminal OUT at the L level with low impedance.

As described above, in the non-selected period of the unit shift register $SR_k$ according to the present embodiment, the transistor Q7 operates to discharge the node N1 with timing synchronized with the clock signal CLKA, which prevents the node N1 from rising in level. Further, the transistors Q2 and Q14 alternately discharge the output terminal OUT, which prevents the occurrence of output signal $G_k$ as an error signal. Since the gate electrodes of the transistors Q2, Q7 and Q14 are not continuously positive-biased, the positive shift of their threshold voltages is suppressed.

When the output signal $G_{k-1}$ from the immediately preceding stage rises to the H level to bring the unit shift register $SR_k$ into the selected period, the dual-gate transistor Q3D of the unit shift register $SR_k$ turns on, to bring the node N1 into the H level. At this time, the inverter formed of the loading capacitor C3 and transistor Q6 is deactivated and the node N2 is at the L level. Then, when the clock signal CLKA rises to the H level, the inverter is activated, but the node N2 is kept at the L level since the transistor Q6 is on. Therefore, the transistor Q7 is kept off in the selected period, so that the node N1 is kept at the H level in the floating state (raised by the clock signal CLKA). The unit shift register $SR_k$ can thereby output the output signal $G_k$ normally.

As described above, in the unit shift register SR according to the present embodiment, the node N1 changes in level similarly to the first preferred embodiment. More specifically, the unit shift register SR operates to keep the reset mode in the non-selected period and to be brought into the set mode in the selected period. The unit shift register SR can thereby perform a shift operation similarly to the first preferred embodiment.

The present embodiment also achieves the effect of suppressing the negative shift of threshold voltages of the transistors Q3a and Q3b constituting the dual-gate transistor Q3D. This prevents the occurrence of malfunctions of the unit shift register SR, increase in consumption power, and reduction in power supply voltage.

Eighth Preferred Embodiment

The present embodiment will describe an example in which the dual-gate transistor Q3D according to the present invention is applied to a shift register (bidirectional shift register) capable of switching the direction of shifting signals.

FIG. 19 is a circuit diagram of a unit shift register SR according to the eighth preferred embodiment. The unit shift register SR is a bidirectional shift register. The unit shift register SR is configured similarly to that of FIG. 11, except that the transistor Q4 is replaced by a transistor Q4D (transistors Q4a and Q4b) according to the present invention. Similarly to the transistor Q3D shown in FIG. 1, the dual-gate transistor Q4D also has a large parasitic capacitance between its gate and the connection node between the transistors Q4a and Q4b (defined as a "node N6") such that the node N6 is pulled down to the L level in accordance with the change of the gate electrode from the H level to the L level.

A unit shift register performing a shift operation only in one direction is basically brought into the set mode when the input terminal receives a signal and into the reset mode when the reset terminal receives a signal, however, a bidirectional shift register does not require such distinction since the input terminal and reset terminal are exchanged in function in accordance with the direction of shifting a signal. For ease of description, the terminal to which the gate of the dual-gate transistor Q3D is connected will be called a "first input terminal IN1", and the terminal to which the gate of the dual-gate transistor Q4D is connected will be called a "second input terminal IN2".

The unit shift register SR which is a bidirectional shift register receives a first voltage signal VN and a second voltage signal VR, each of which is a control signal for determining the direction of shifting a signal. The dual-gate transistor Q3D is connected between a first voltage signal terminal TN supplied with the first voltage signal VN and the node N1, and the dual-gate transistor Q4D is connected between a second voltage signal terminal TR supplied with the second voltage signal VR and the node N1. The first voltage signal VN and second voltage signal VR are complementary to each other.

For instance, when the first voltage signal VN is at the H level (VDD) and second voltage signal VR is at the L level (VSS), the first voltage signal terminal TN is at VDD and second voltage signal terminal TR is at VSS in FIG. 19. At this time, the dual-gate transistor Q3D serves as the charging circuit of the node N1, and the dual-gate transistor Q4D serves as the discharging circuit of the node N1. In this state, the first input terminal IN1 serves as the input terminal IN1 shown in FIG. 11, and the second input terminal IN2 serves as the reset terminal RST shown in FIG. 11.

Conversely, when the first voltage signal VN is at the L level (VSS) and second voltage signal VR is at the H level (VDD), the dual-gate transistor Q3D serves as the discharging circuit of the node N1, and the dual-gate transistor Q4D serves as the charging circuit of the node N1. In this state, the first input terminal IN1 serves as the reset terminal RST shown in FIG. 11, and the second input terminal IN2 serves as the input terminal IN1 shown in FIG. 11.

That is, in a multistage shift register including unit shift registers SR, each being as described above, connected in cascade as shown in FIG. 2, the unit shift registers SR are activated in the order of output signals $G_1, G_2, G_3, \ldots$ when the first voltage signal VN is at the H level and the second voltage signal is at the L level (forward shift). Conversely, when the first voltage signal VN is at the L level and the second voltage signal VR is at the H level, the unit shift registers SR are activated in the order of output signals $G_n$, $G_{n-1}, G_{n-2}, \ldots$ (reverse shift).

The present embodiment therefore achieves the effect of suppressing the negative shift of threshold voltage in the transistors Q3a and Q3b constituting the dual-gate transistor Q3D in the forward shift operation, and suppressing the negative shift of threshold voltage in the transistors Q4a and Q4b constituting the dual-gate transistor Q4D in the reverse shift operation. This prevents the occurrence of malfunctions of the unit shift register SR, increase in consumption power, and reduction in power supply voltage, in the present embodiment as well.

While FIG. 19 shows the example in which the dual-gate transistors Q3D and Q4D according to the present invention are applied to the bidirectional shift register on the basis of the configuration of the unit shift register SR according to the second preferred embodiment (FIG. 11), the application of the present invention to the bidirectional shift register is not limited as such. Variations of the present embodiment will be described below.

For instance, FIG. 20 shows an example in which the dual-gate transistors Q3D and Q4D are applied to the bidirectional shift register on the basis of the configuration of the unit shift register SR according to the third preferred embodiment (FIG. 12). More specifically, the circuit shown in FIG. 19 is provided with the transistor Q7 intended to discharge the node N1 in the non-selected period. FIGS. 21 and 22 show alternative examples in which the dual-gate transistors Q3D and Q4D are applied to the bidirectional shift register on the basis of the configuration of the unit shift registers SR according to the seventh preferred embodiment (FIG. 18) and fourth preferred embodiment (FIG. 13), respectively. These variations also achieve similar effects as described above.

Ninth Preferred Embodiment

As described above, the amount of change in level at the node N3 between the transistors Q3a and Q3b in the dual-gate transistor Q3D when the gates of the transistors Q3a and Q3b (input terminal IN1 of the unit shift register SR) change from the H level (VDD) to the L level (VSS=0V) is expressed as VDD×Cgs/(Cgs+Cstr) where Cgs denotes the capacitive component between the input terminal IN1 and node N3 and Cstr denotes the parasitic capacitance accompanied with the node N3 not contained in Cgs. This means that the node N3 can be pulled down to lower levels as the capacitive component Cgs between the input terminal IN1 and node N3 increases relative to the parasitic capacitance Cstr (i.e., the ratio of capacitive component Cgs in the whole parasitic capacitance accompanied with the node N3 increases).

Figure 23:
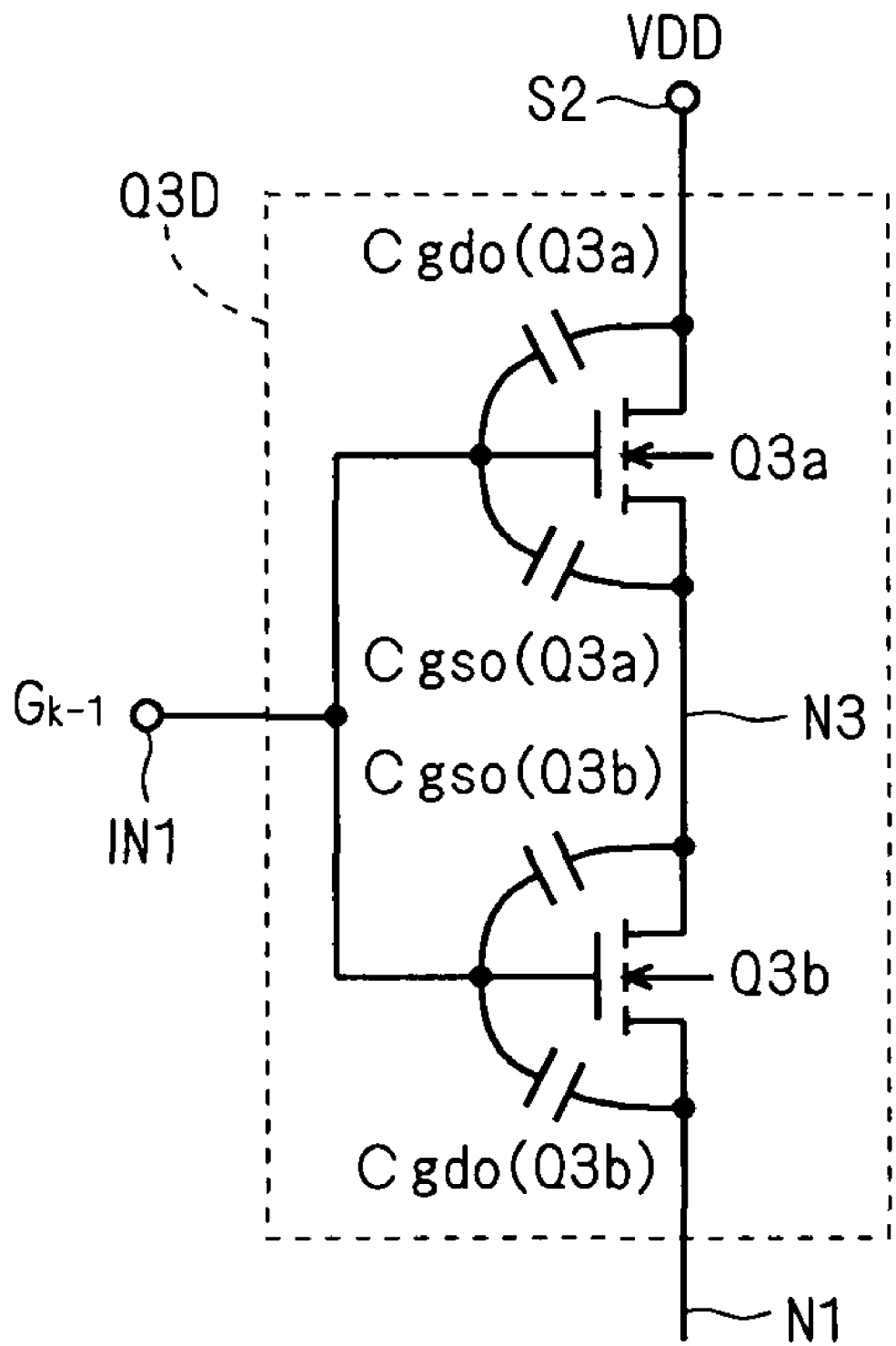
FIG. 23 shows the distribution of overlap capacitance in a dual-gate transistor.

The present embodiment will therefore describe a technique for increasing the capacitive component between the input terminal IN1 and node N3 in the dual-gate transistor Q3D. A typical field effect transistor has an overlap capacitance between the gate and source/drain as a parasitic capacitance. Accordingly, the dual-gate transistor Q3D has the gate-to-drain overlap capacitance Cgdo (Q3a) and gate-to-source overlap capacitance Cgso (Q3a) of the transistor Q3a and the gate-to-drain overlap capacitance Cgdo (Q3b) and gate-to-source overlap capacitance Cgso (Q3b) of the transistor Q3b as the parasitic capacitance, as shown in FIG. 23.

Among these, the gate-to-source overlap capacitance Cgso (Q3a) of the transistor Q3a and gate-to-source overlap capacitance Cgso (Q3b) of the transistor Q3b contribute to the parasitic component (Cgs) between the input terminal IN1 and node N3, and it is preferable that these capacitance values be sufficiently large in the present invention.

Figure 24A:
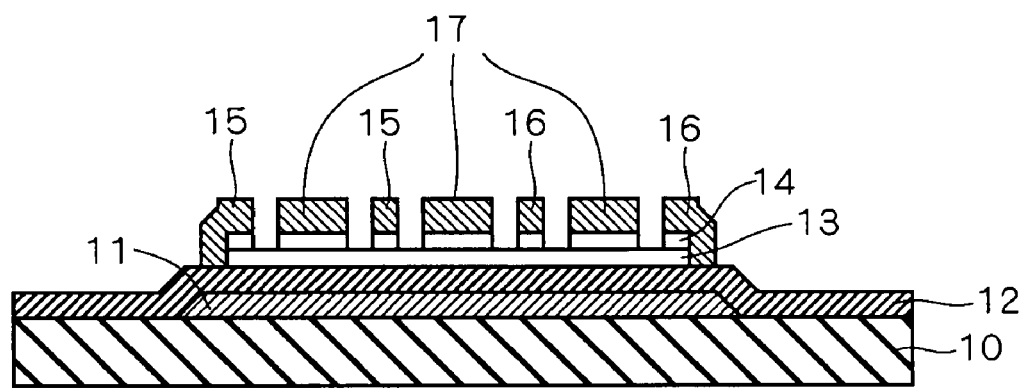
FIGS. 24A, 24B, 25A and 25B show the structure of a dual-gate transistor according to a ninth preferred embodiment of the present invention.
Figure 24B:
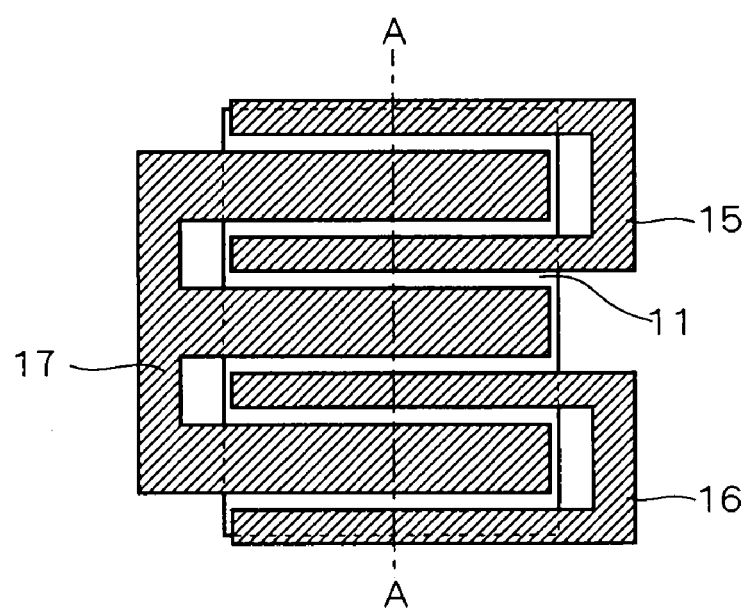

FIGS. 24A and 24B show the structure of the dual-gate transistor Q3D according to the present embodiment. FIG. 24A is a sectional view of the dual-gate transistor Q3D, and FIG. 24B is a top view thereof. FIG. 24A corresponds to a cross section taken along the line A-A shown in FIG. 24B.

The dual-gate transistor Q3D is what is called a "bottom gate transistor" with the source/drain region arranged on the gate electrode. More specifically, this dual-gate transistor Q3D includes a gate electrode 11 formed on a glass substrate 10, a gate insulation film 12 formed on the gate electrode 11, an active region 13 (intrinsic silicon) formed on the gate insulation film 12 and a contact layer 14 (N+ silicon) formed on the active region 13. The contact layer 14 is to be the source/drain region of the transistors Q3a and Q3b, and installed thereon are a drain interconnection 15 for the transistor Q3a, a drain interconnection 16 for the transistor Q3b and a source interconnection 17 for the transistors Q3a and Q3b.

For instance, in the unit shift register SR shown in FIG. 7, the gate electrode 11 is connected to the input terminal IN1 of the unit shift register SR, the drain interconnection 15 for the transistor Q3a is connected to the second power terminal S2, and the drain interconnection 16 for the transistor Q3b is connected to the node N1. The source interconnection 17 for the transistors Q3a and Q3b is to be the node N3.

In the present embodiment, the pattern of the interconnection 17 to be the node N3 is extended (increased in width) relative to the other interconnections 15 and 16, as shown in FIG. 24B. This increases the area in which the gate electrode 11 and interconnection 17 are opposed to each other, so that the overlap capacitances Cgso (Q3a) and Cgso (Q3b) can be increased. In other words, the capacitive component between the input terminal IN1 and node N3 (Cgs≈Cgso (Q3a)+Cgso (Q3b)) can be increased.

As a result, the node N3 between the transistors Q3a and Q3b can be pulled down to sufficiently lower levels when the gate of the dual-gate transistor Q3D changes from the H level to the L level, which improves the effect of the present invention of suppressing the negative shift of threshold voltage.

At this time, the pattern of the drain interconnection 15 for the transistor Q3a and drain interconnection 16 for the transistor Q3b may also be extended, which also brings about the aforementioned effect. This, however, significantly increases the area in which the dual-gate transistor Q3D is formed. It is therefore preferable to increase the pattern of the source interconnection 17 to be the node N3 only, as shown in FIG. 24B. In other words, it is preferable to increase the values of Cgso (Q3a) and Cgso (Q3b) only while keeping the values of Cgdo (Q3a) and Cgdo (Q3b) unchanged in FIG. 23. As a result, the relations: Cgso (Q3a)>Cgdo (Q3a); and Cgso (Q3b)>Cgdo (Q3b) hold.

Increasing the width of the interconnection 17 to be the node N3 as in the present embodiment may be considered to increase the parasitic capacitance Cstr of the node N3 not contained in the parasitic component Cgs as well as Cgs; actually, however, the parasitic capacitance Cstr hardly increases.

The parasitic capacitance Cstr is a "fringe capacitance" of the interconnection 17 such as the capacitance to the ground in the interconnection 17, parasitic capacitance between the interconnection 17 and a counter electrode (common electrode) provided above the glass substrate 10 in, for example, a liquid crystal display, or the like. Since the ground electrode and common electrode are distant from the interconnection 17, the value of the aforementioned fringe capacitance hardly varies even when the width of the interconnection 17 is changed. This is the reason why the increase in width of the interconnection 17 hardly causes an increase in parasitic capacitance Cstr in the present embodiment.

In contrast, the gate-to-source overlap capacitances Cgso (Q3a) and Cgso (Q3b) may be considered as a parallel plate capacitor in which the interconnection 17 and the gate electrode 11 are opposed to each other. Therefore, increasing the width of the interconnection 17, the values of Cgso (Q3a) and Cgso (Q3b) increase nearly in proportion thereto.

Therefore, according to the present embodiment, the value of the parasitic component Cgs can be increased while keeping the parasitic capacitance Cstr unchanged. In other words, the ratio of the parasitic component Cgs contained in the parasitic capacitance accompanied with the node N3 can be increased. As a result, the node N3 can be pulled down to lower levels when the gates of the transistors Q3a and Q3b (input terminal IN1 of the unit shift register SR) change from the H level to the L level, which brings about the aforementioned effects.

Figure 25A:
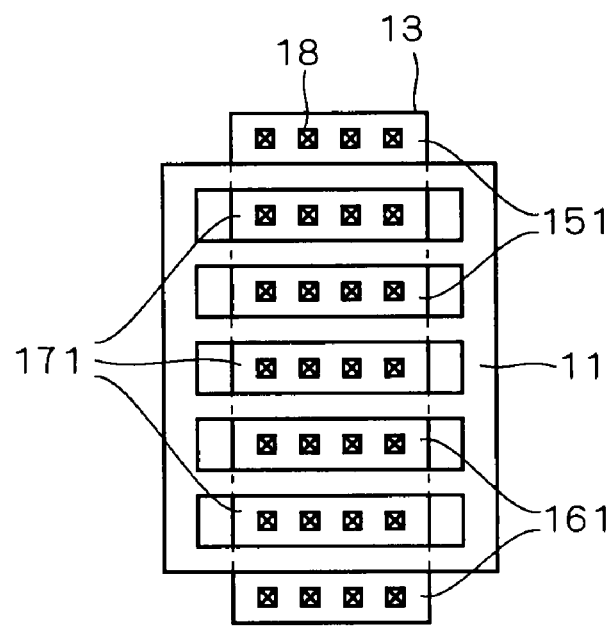
Figure 25B:
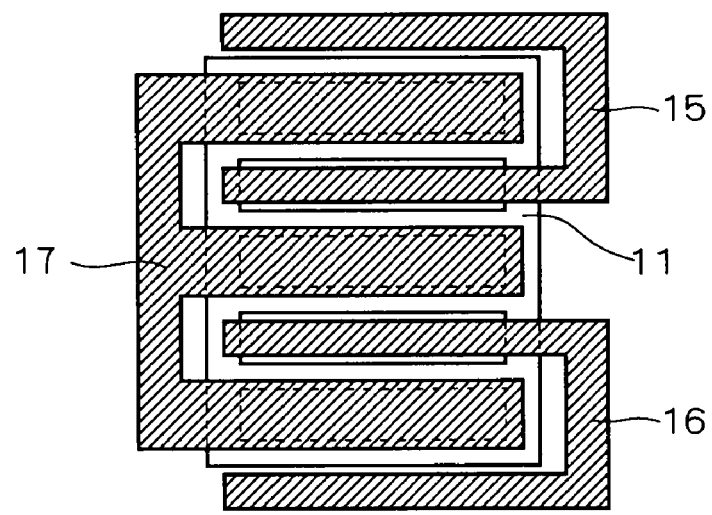

While the bottom gate transistor has been described above by way of example, the present embodiment may also be applied to a "top gate transistor" in which the gate electrode 11 is provided on the active region 13, for example. FIGS. 25A and 25B show the example in which the dual-gate transistor Q3D is a top gate transistor.

In the case of top gate transistor, the gate electrode 11 is formed into a linear pattern crossing over the active region 13, as shown in FIG. 25A. A drain region 151 of the transistor Q3a, a drain region 161 of the transistor Q3b and a source region 171 of the transistors Q3a and Q3b are formed within the active region 13 under the gate electrode 11, and a contact 18 is formed thereon for connecting these regions with upper-layer interconnections. FIG. 25B shows the pattern of interconnections.

In this case, the pattern of the interconnection 17 to be the node N3 is also extended relative to the other interconnections 15 and 16. This increases the area in which the gate electrode 11 and interconnection 17 are opposed to each other, so that the overlap capacitances Cgso (Q3a) and Cgso (Q3b) can be increased, which brings about the aforementioned effects.

The present embodiment may be applied to the dual-gate transistor Q3D according to any one of the first to eighth preferred embodiments. While only the dual-gate transistor Q3D has been described above, it is apparent that the present embodiment may also be applied to the dual-gate transistor Q10D according to the variations of the fifth preferred embodiment shown in FIG. 16 and dual-gate transistor Q4D according to the eighth preferred embodiment.

Tenth Preferred Embodiment

In the above-described preferred embodiments, the means for pulling down the node N3 of the dual-gate transistor Q3D is the parasitic capacitance (gate-to-source overlap capacitances of the transistors Q3a and Q3b) between the gate of the dual-gate transistor Q3D (input terminal IN1) and node N3.

Figure 26A:
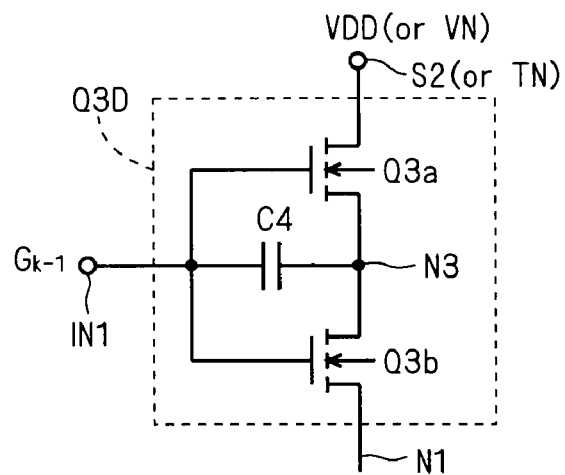
FIGS. 26A to 26C show the configuration of a dual-gate transistor according to a tenth preferred embodiment of the present invention.

In order to pull down the node N3 to lower levels, the capacitive component between the gate and node N3 may be increased, as described above. Therefore, in the present embodiment, a capacitive element C4 is connected between the gate of the dual-gate transistor Q3D and node N3, as shown in FIG. 26A. This can increase the capacitive component between the gate of the dual-gate transistor Q3D and node N3 without using the technique described in the ninth preferred embodiment, which ensures the node N3 to be pulled down to the L level. That is, the negative shift of threshold voltage of the dual-gate transistor Q3D can be prevented with more reliability.

Figure 26B:
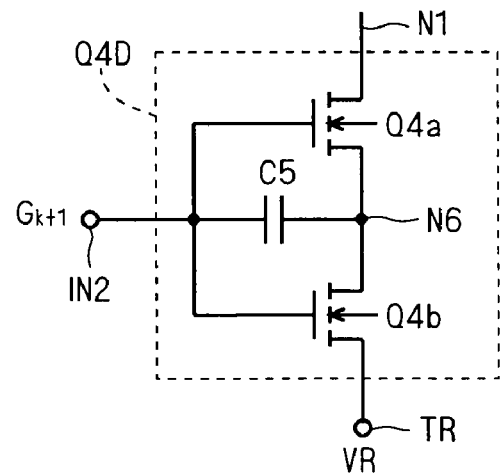
Figure 26C:
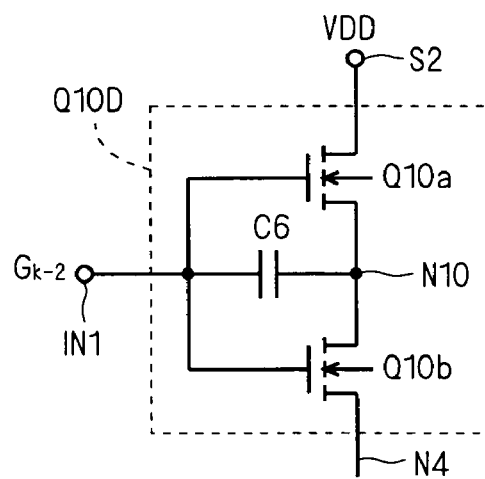

The present embodiment may be applied to the dual-gate transistor Q3D according to any one of the first to eighth preferred embodiments, and also to the dual-gate transistor Q4D according to the eighth preferred embodiment. In that case, a capacitive element C5 may be connected between the gate of the dual-gate transistor Q4D and node N6, as shown in FIG. 26B. The present embodiment may also be applied to the dual-gate transistor Q10D according to the variations of the fifth preferred embodiment shown in FIG. 16. In that case, a capacitive element C6 may be connected between the gate of the dual-gate transistor Q10D and node N10, as shown in FIG. 26C.

Eleventh Preferred Embodiment

In the above-described preferred embodiments, the means for pulling down the node N3 of the dual-gate transistor Q3D is the capacitive component between the gate of the dual-gate transistor Q3D (input terminal IN1) and node N3, however, a diode may be used instead.

Figure 27A:
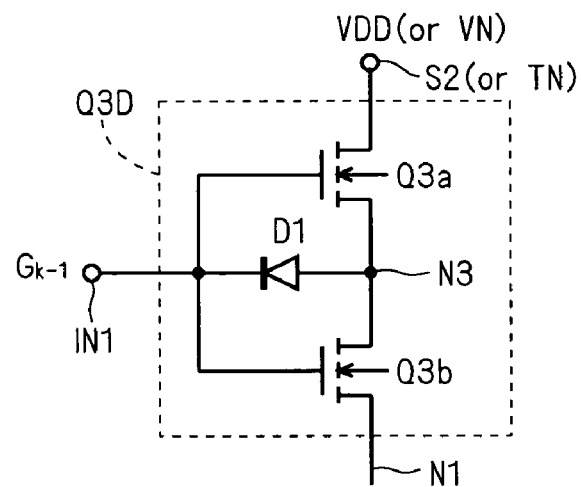
FIGS. 27A to 27C show the configuration of a dual-gate transistor according to an eleventh preferred embodiment of the present invention.

FIG. 27A shows the dual-gate transistor Q3D according to the present embodiment. As shown, a diode D1 is connected between the gate of the dual-gate transistor Q3D and node N3 such that the gate serves as the cathode and the node N3 serves as the anode. In this case, the node N3 is also pulled down to the L level following the change of the gate of the dual-gate transistor Q3D from the H level to the L level. Therefore, the dual-gate transistor Q3D shown in FIG. 27A also brings about the effect of suppressing the negative shift of threshold voltage, similarly to the first preferred embodiment.

In the above-described preferred embodiments, the node N3 is brought into the L level in the floating state when the node N3 is pulled down. Therefore, the node N3 rises in level when leakage current occurs in the transistors Q3a and Q3b, which arises the problem of reducing the effect of the present invention.

In contrast, in the dual-gate transistor Q3D shown in FIG. 27A, even if the node N3 is about to rise in level due to leakage current, the charges are discharged through the diode D1. That is, the level of the node N3 will not exceed the threshold voltage of the diode D1 even when leakage current occurs, which can solve the above problem.

Figure 27B:
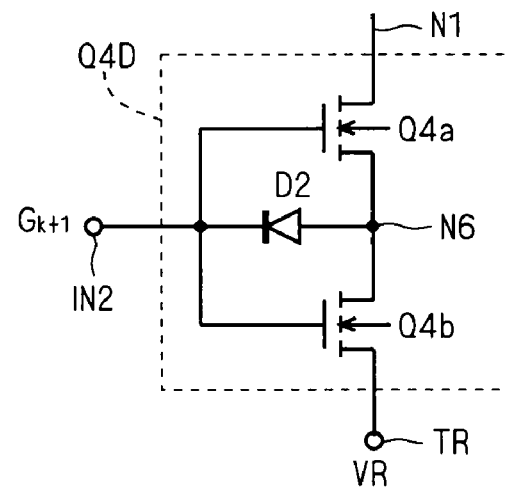
Figure 27C:
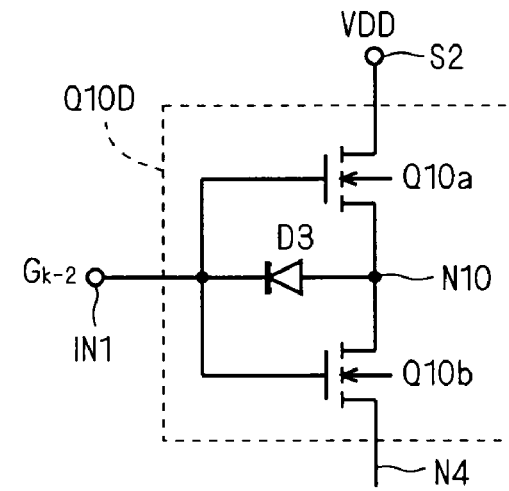

The present embodiment may be applied to the dual-gate transistor Q3D of the unit shift register SR according to any one of the first to eighth preferred embodiments, and also to the dual-gate transistor Q4D according to the eighth preferred embodiment. In that case, a diode D2 may be connected between the gate of the dual-gate transistor Q4D and node N6 such that the gate serves as the cathode and the node N6 serves as the anode, as shown in FIG. 27B. The present embodiment may also be applied to the dual-gate transistor Q10D according to the variations of the fifth preferred embodiment shown in FIG. 16. In that case, a diode D3 may be connected between the gate of the dual-gate transistor Q10D and node N10 such that the gate serves as the cathode and the node N10 serves as the anode, as shown in FIG. 27C.

Twelfth Preferred Embodiment

The present embodiment employs a transistor for the means for pulling down the node N3 of the dual-gate transistor Q3D.

Figure 29:
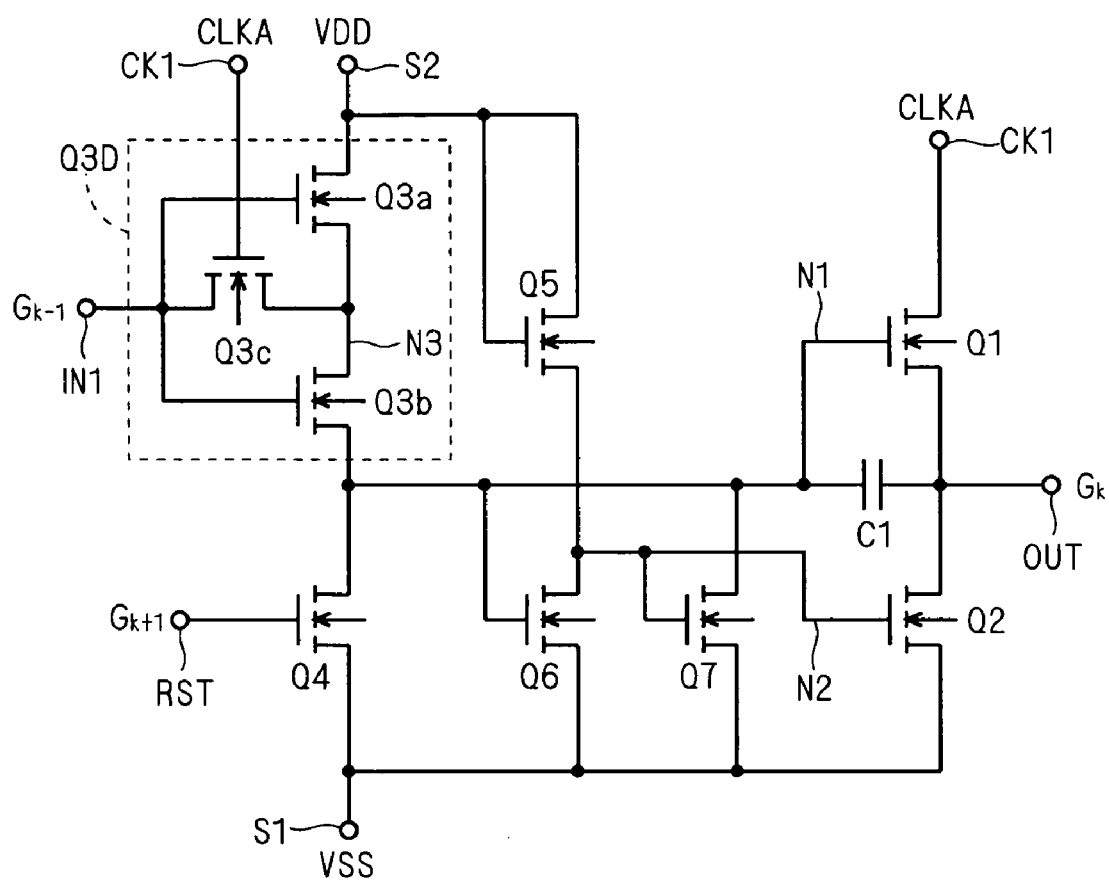
FIG. 29 is a circuit diagram of a unit shift register according to the twelfth preferred embodiment.

FIG. 28A shows the dual-gate transistor Q3D according to the present embodiment. As shown, a transistor Q3c which turns on when a signal (output signal $G_{k-1}$ from the immediately preceding stage) input to the gate of the dual-gate transistor Q3D changes from the H level to the L level is connected between the gate of the dual-gate transistor Q3D and node N3. FIG. 29 shows an example in which the dual-gate transistor Q3D shown in FIG. 28A is applied to the unit shift register $SR_k$ shown in FIG. 12.

When the unit shift registers SR are connected in cascade, the input terminal IN1 of the unit shift register $SR_k$ of the k-th stage receives the output signal $G_{k-1}$ from the immediately preceding stage. Accordingly, the gate of the transistor Q3c may be connected to the clock terminal CK1 in order to turn on the transistor Q3c when the signal (output signal $G_{k-1}$ from the immediately preceding stage) input to the gate of the dual-gate transistor Q3D changes from the H level to the L level.

For instance, assuming that the clock terminal CK1 of the unit shift register $SR_k$ receives the clock signal CLKA, the output signal $G_{k-1}$ from the immediately preceding stage rises to the H level with timing when the clock signal CLKB rises. When the output signal $G_{k-1}$ from the immediately preceding stage rises to the H level, the transistors Q3a and Q3b turn on, bringing the nodes N1 and N3 into the H level. Since the clock signal CLKA input to the clock terminal CK1 is at the L level at this time, the transistor Q3c is off.

Thereafter, when the output signal $G_{k-1}$ from the immediately preceding stage changes to the L level, the transistors Q3a and Q3b turn off. Since the clock signal CLKA rises to the H level at this time, the transistor Q3c turns on. As a result, the node N3 is discharged by the transistor Q3c to be pulled down to the L level. That is, the gate is prevented from becoming lower in potential than both the source and drain in each of the transistors Q3a and Q3b. Therefore, the effect of suppressing the negative shift of threshold voltage in the dual-gate transistor Q3D can be obtained, similarly to the first preferred embodiment.

The present embodiment may be applied to the dual-gate transistor Q3D of the unit shift register SR according to any one of the first to eighth preferred embodiments, and also to the dual-gate transistor Q4D according to the eighth preferred embodiment. In that case, a transistor Q4c having its gate connected to the clock terminal CK1 may be connected between the gate of the dual-gate transistor Q4D and node N6, as shown in FIG. 28B.

The present embodiment may also be applied to the dual-gate transistor Q10D according to the variations of the fifth preferred embodiment shown in FIG. 16. In that case, a transistor Q10c may be connected between the gate of the dual-gate transistor Q10D and node N10, as shown in FIG. 28C. The gate of the dual-gate transistor Q10D receives the output signal $G_{k-2}$ from the second preceding stage, and the transistor Q10c needs to be turned on when the output signal $G_{k-2}$ changes from the H level to the L level. Accordingly, the gate of the transistor Q10c is connected to the clock terminal CK2 supplied with a clock signal of different phase from the signal supplied to the first clock terminal CK1, as shown in FIG. 28C.

While the invention has been shown and described in detail, the foregoing description is in all aspects illustrative and not restrictive. It is therefore understood that numerous modifications and variations can be devised without departing from the scope of the invention.

What is claimed is:

1. A shift register comprising:
  an input terminal, an output terminal, a first clock terminal and a reset terminal;
  a first transistor to supply a first clock signal received at said first clock terminal to said output terminal;
  a second transistor to discharge said output terminal in accordance with a discharging signal;
  a charging circuit to charge a first node to which a control electrode of said first transistor is connected, in accordance with an input signal received at said input terminal; and
  a discharging circuit to discharge said first node in accordance with a reset signal received at said reset terminal, wherein said charging circuit includes a plurality of third transistors, connected in series between said first node and a power terminal, with control electrodes connected in common to said input terminal, and said discharging circuit includes a fourth transistor having a control electrode connected to said reset terminal, the fourth transistor being connected to said first node and discharging the first node, said charging circuit turns on said plurality of third transistors when said input signal reaches a voltage level (H) higher than a threshold voltage of said plurality of third transistors, to thereby charge said first node, and then pulls down each connection node between said plurality of third transistors to a voltage level (L) lower than said threshold voltage when the input signal changes to the L level, and a width of an electrode being a connection point between any one of the plurality of third transistors and another one of the plurality of third transistors is greater than a width of an electrode being a connection point between one of the plurality of third transistors and the fourth transistor.

2. The shift register according to claim 1, wherein said second transistor has a control electrode connected to said reset terminal.

3. The shift register according to claim 1, further comprising an inverter with said first node serving as its input node and a second node connected to the control electrode of said second transistor serving as the discharging signal.

* * * * *